(12) United States Patent
Cho et al.

(10) Patent No.: US 8,633,043 B2
(45) Date of Patent: Jan. 21, 2014

(54) METHOD OF FABRICATING FRINGE FIELD SWITCHING LIQUID CRYSTAL DISPLAY DEVICE

(75) Inventors: Yong-Soo Cho, Daegu (KR); Young-Seok Choi, Gyeonggi-Do (KR); Dong-Hee Kim, Gyeongsangbuk-Do (KR); Kyo-Ho Moon, Daegu (KR); Chul-Tae Kim, Gyeongsangbuk-Do (KR); Kyu-Sun Choi, Gyeongsangbuk-Do (KR)

(73) Assignee: LG Display Co., Ltd., Seoul (KR)

( * ) Notice: Subject to any disclaimer, the term of this patent is extended or adjusted under 35 U.S.C. 154(b) by 208 days.

(21) Appl. No.: 13/332,666

(22) Filed: Dec. 21, 2011

(65) Prior Publication Data

US 2012/0315715 A1     Dec. 13, 2012

(30) Foreign Application Priority Data

Jun. 9, 2011  (KR) .................. 10-2011-0055784

(51) Int. Cl.
*H01L 21/02*   (2006.01)

(52) U.S. Cl.
USPC .............. 438/30; 257/E21.002; 438/158

(58) Field of Classification Search
USPC .............. 438/30, 140, 149, 158, 104
See application file for complete search history.

(56) References Cited

U.S. PATENT DOCUMENTS

| | | | |
|---|---|---|---|
| 8,451,395 B2 * | 5/2013 | Nagano et al. | 349/43 |
| 2008/0158457 A1 * | 7/2008 | Park et al. | 349/39 |
| 2008/0266479 A1 * | 10/2008 | Lim | 349/46 |
| 2010/0051935 A1 * | 3/2010 | Lee et al. | 257/43 |
| 2010/0210056 A1 * | 8/2010 | Seo et al. | 438/34 |
| 2010/0301327 A1 * | 12/2010 | Kang et al. | 257/43 |
| 2010/0308324 A1 * | 12/2010 | Kim et al. | 257/43 |
| 2012/0086009 A1 * | 4/2012 | Shin et al. | 257/59 |
| 2012/0162162 A1 * | 6/2012 | Kong et al. | 345/205 |
| 2012/0261755 A1 * | 10/2012 | Chen et al. | 257/347 |

* cited by examiner

*Primary Examiner* — Savitr Mulpuri
(74) *Attorney, Agent, or Firm* — Morgan, Lewis & Bockius LLP

(57) ABSTRACT

A method of fabricating a fringe field switching (FFS)-liquid crystal display (LCD) device may have the following advantage. An inferior connection between the drain electrode and the pixel electrode may be prevented by preventing formation of a copper compound on the drain electrode, by performing a back channel etching after patterning a pixel electrode, and by performing a wet strip rather than a dry strip. This may result in a direct contact between copper and ITO, thereby reducing the number of mask processes.

8 Claims, 30 Drawing Sheets

METHOD OF FABRICATING FRINGE FIELD SWITCHING LIQUID CRYSTAL DISPLAY DEVICE

CROSS-REFERENCE TO RELATED APPLICATION

This application claims the benefit of Korean Patent Application No. 10-2011-0055784, filed on Jun. 9, 2011, which is hereby incorporated by reference for all purposes as if fully set forth herein.

BACKGROUND OF THE INVENTION

1. Field of the Invention

The present invention relates to a method of fabricating a fringe field switching (FFS)-liquid crystal display (LCD) device, and particularly, to a method of fabricating an FFS-LCD device capable of implementing a high resolution and a wide viewing angle.

2. Related Art of the Invention

As concerns about information displays and demands for portable information media increase, research and commercialization of flat panel displays (FPD) replacing the conventional display apparatus, Cathode Ray Tubes (CRT) are actively ongoing. One of these flat panel displays, a Liquid Crystal Display (LCD) device serves to display an image by using optical anisotropy of a liquid crystal (LC). Owing to an excellent resolution, color reproduction characteristic, and picture quality, the LCD device is being actively applied to a notebook, a desk top monitor, etc.

The LCD device is comprised of a color filter substrate, an array substrate, and an LC layer interposed between the color filter substrate and the array substrate.

Hereinafter, a structure of the related art LCD device will be explained in more detail with reference to FIG. 1.

FIG. 1 is a disassembled perspective view schematically showing a structure of the related art LCD.

As shown in FIG. 1, the LCD device comprises a color filter substrate 5, an array substrate 10, and an LC layer 30 interposed between the color filter substrate 5 and the array substrate 10.

The color filter substrate 5 consists of a color filter (C) composed of a plurality of sub color filters 7 for implementing red, green and blue (RGB) colors, a black matrix 6 for dividing the sub color filters 7 from each other and shielding light passing through the LC layer 30, and a transparent common electrode 8 for applying a voltage to the LC layer 30.

The array substrate 10 consists of a plurality of gate lines 16 and data lines 17 arranged in horizontal and vertical directions to define a plurality of pixel regions (P), Thin Film Transistors (TFT), switching devices formed at each intersection between the gate lines 16 and the data lines 17, and pixel electrodes 18 formed in the pixel regions (P).

The color filter substrate 5 and the array substrate 10 facing each other are bonded to each other by a sealant (not shown) formed on an outer periphery of an image display region, thereby constituting an LC panel. The color filter substrate 5 and the array substrate 10 are bonded to each other by bonding keys (not shown) formed at the color filter substrate 5 or the array substrate 10.

The LCD device is generally driven by a twisted nematic (TN) method for driving nematic LC molecules in a direction perpendicular to a substrate. However, the TN method has a disadvantage that an LCD device has a narrow viewing angle of 90°. This results from refractive anisotropy of LC molecules. More concretely, LC molecules aligned in a direction parallel to a substrate are re-aligned in a direction perpendicular to the substrate when a voltage is applied to a panel.

In order to solve the disadvantage, has been proposed an In Plane Switching (IPS)-LCD device capable of widening a viewing angle to an angle more than 170° by driving LC molecules in a direction parallel to a substrate. This will be explained in more details.

FIGS. 2 and 3 are sectional views showing part of an array substrate of an IPS-LCD device, which schematically shows part of an array substrate of a Fringe Field Switching (FFS)-LCD device. The FFS-LCD device displays an image by driving LC molecules disposed on a pixel region and a common electrode, by allowing a fringe field formed between a pixel electrode and a common electrode to penetrate through a slit.

In the FFS-LCD device, in a state that LC molecules are horizontally aligned, a common electrode is formed at a lower part and a pixel electrode is formed at an upper part. This may generate an electric field in horizontal and vertical directions, thereby allowing LC molecules to be twisted and tilted.

FIG. 2 shows that an array substrate has been fabricated by performing a photolithography process (hereinafter, will be referred to as a mask process) six times, and FIG. 3 shows that an array substrate has been fabricated by performing a mask process five times.

Referring to FIGS. 2 and 3, in the related art FFS-LCD device, gate lines (not shown) and data lines (not shown) are horizontally and vertically arranged on the transparent array substrate 10, thereby defining pixel regions. A switching device, a thin film transistor (TFT) is formed at each intersection between the gate lines and the data lines.

The TFT consists of a gate electrode 21 connected to the gate line, a source electrode 22 connected to the data line, and a drain electrode 23 connected to the pixel electrode 18. And, the TFT includes a gate insulation film 15a for insulating the gate electrode 21 from the source electrode 22 and the drain electrode 23, and an active layer 24 for forming a conductive channel between the source electrode 22 and the drain electrode 23 by a gate voltage supplied to the gate electrode 21.

Source and drain regions of the active layer 24 form ohmic contacts together with the source electrode 22 and the drain electrode 23, through an ohmic contact layer 25n.

The common electrode 8 and the pixel electrode 18 are formed in the pixel region. The common electrode 8 includes a plurality of slits (8s) therein so as to generate a fringe field together with the pixel electrode 18 of a box shape.

The pixel electrode 18 of FIG. 2 is electrically connected to the drain electrode 23 via a contact hole of a first passivation film 15b, and the pixel electrode 18 of FIG. 3 is directly electrically connected to the drain electrode 23 without a contact hole.

Reference numeral 15c of FIG. 2 denotes a second passivation film.

The array substrate is bonded to a color filter substrate by a sealant formed at an outer periphery of an image display region, in a state that a cell gap is constantly maintained between the array substrate and the color filter substrate by a column spacer. The color filter substrate is provided with the TFTs, black matrixes for preventing light leakage to the gate lines and the data lines, a color filter for implementing red, green and blue (RGB) colors, and an overcoat layer.

The FFS-LCD device has an advantage that a viewing angle is wide. Furthermore, the FFS-LCD device is capable of enhancing an aperture ratio by reducing regions of black matrixes in a case that the common electrode is formed over the data lines.

Generally, the array substrate including TFTs is fabricated through a plurality of mask processes. For enhanced productivity, it is required to reduce the number of mask processes. However, the FFS-LCD device of FIG. 3 fabricated through mask processes having a frequency reduced by a single process may have an inferiority that Indium Tin Oxide (ITO) of a pixel electrode connected to a drain electrode is eroded.

FIGS. 4A to 4E are sectional views sequentially showing processes of fabricating the array substrate of FIG. 3.

As shown in FIG. 4A, a gate electrode 21 formed of a conductive metallic material, and a gate line (not shown) are formed on an array substrate through a photolithography process (first mask process).

Then, as shown in FIG. 4B, on the array substrate 10 having thereon the gate electrode 21 and the gate line, sequentially deposited are a gate insulation film 15a, an amorphous silicon thin film, an n+ amorphous silicon thin film and a conductive metallic material.

Then, the amorphous silicon thin film, the n+ amorphous silicon thin film, and the conductive metallic material are selectively patterned through a photolithography process (second mask process), thereby forming an active layer 24 formed of the amorphous silicon thin film in a state that the gate insulation film 15a has been disposed on the gate electrode 21. And, the source electrode 22 and the drain electrode 23 formed of the conductive material are formed on the active layer 24. Data lines (not shown) which define pixel regions together with the gate lines are formed through the second mask process.

Between the active layer 24 and the source and drain electrodes 22 and 23, formed is an ohmic-contact layer 25n for ohmic-contacting the active layer 24 and the source and drain electrodes 22 and 23 with each other.

As shown in FIG. 4C, a transparent conductive material is deposited on an entire surface of the array substrate 10, and then is selectively patterned through a photolithography process (third mask process). As a result, formed is a pixel electrode 18 electrically connected to the drain electrode 23.

As shown in FIG. 4D, a passivation film 15b is deposited on an entire surface of the array substrate 10 where the source electrode 22, the drain electrode 23 and the data lines have been formed. Then, part of the passivation film 15b is removed through a photolithography process (fourth mask process), thereby forming a contact hole (not shown).

Finally, as shown in FIG. 4E, a transparent conductive material is deposited on an entire surface of the array substrate 10, and then is selectively patterned through a photolithography process (fifth mask process). As a result, implemented is a common electrode 8 formed of the transparent conductive material. The common electrode 8 includes a plurality of slits (8s) therein so as to generate a fringe field together with the pixel electrode 18 disposed therebelow.

In the FFS-LCD device, the number of mask processes may be reduced by a single process since the pixel electrode is directly formed on the drain electrode. However, ITO of the pixel electrode connected to the drain electrode may be partially eroded due to problems occurring during the process. This will be explained in more details with reference to the drawings.

FIGS. 5A to 5I are sectional views showing second and third mask processes of FIGS. 4B and 4C.

As shown in FIG. 5A, on an entire surface of the array substrate 10 where the gate electrode 21 and the gate lines have been formed, sequentially deposited are a gate insulation film 15a, an amorphous silicon thin film 20, an n+ amorphous silicon thin film 25 and a conductive metallic material 30.

On the conductive metallic material 30, disposed is a photosensitive film formed of a photosensitive material such as a photoresist. Then, the photosensitive film is selectively irradiated with light through a mask.

Once the exposed photosensitive film is developed, first to third photosensitive film patterns 60a~60c of a predetermined thickness remain in a shielding region and a second transmission region where light has been completely or partially shielded. And, the conductive metallic material 30 is exposed to a first transmission region where light has been completely transmitted.

As shown in FIG. 5B, part of the conductive metallic material is removed, through a wet etching, by using the first to third photosensitive film patterns 60a~60c as a mask. As a result, a conductive film pattern 30' formed of the conductive metallic material is disposed on the array substrate 10.

As shown in FIG. 5C, the amorphous silicon thin film and the n+ amorphous silicon thin film are partially removed, through a dry etching, by using the first to third photosensitive film patterns 60a~60c as a mask. As a result, below the conductive film pattern 30', disposed are an active layer 24 and an n+ amorphous silicon thin film pattern 25' formed of the amorphous silicon thin film and the n+ amorphous silicon thin film, respectively.

Then, an ashing process is performed to partially remove thicknesses of the first to third photosensitive film patterns 60a~60c. As a result, as shown in FIG. 5D, a third photosensitive film pattern of the second transmission region is completely removed.

The first photosensitive film pattern and the second photosensitive film pattern have a thicknesses removed by a thickness of the third photosensitive film pattern, thereby remaining only in the shielding region as a fourth photosensitive film pattern 60a' and a fifth photosensitive film pattern 60b', respectively.

As shown in FIG. 5E, the conductive film pattern is partially removed, through a wet etching, by using the fourth photosensitive film pattern 60a' and the fifth photosensitive film pattern 60b' as a mask. As a result, on the n+ amorphous silicon thin film pattern 25', disposed is a source electrode 22 and a drain electrode 23 formed of the conductive metallic material.

As shown in FIG. 5F, the n+ amorphous silicon thin film pattern is partially removed, through a dry etching, by using the fourth photosensitive film pattern 60a' and the fifth photosensitive film pattern 60b' as a mask (hereinafter, will be referred to as a back channel-etch). As a result, implemented is an ohmic-contact layer 25n formed of the n+ amorphous silicon thin film.

Generally, the dry etching is performed by using a gas mixture of $SF_6$, $Cl_2$, He, etc., and the $SF_6$ and the $Cl_2$ react with copper (Cu) of the drain electrode 23, thereby forming a copper compound such as $CuF_2$ and $CuCl_2$.

Then, as shown in FIG. 5G, the fourth photosensitive film pattern 60a' and the fifth photosensitive film pattern 60b' are removed through a dry strip.

Generally, the dry strip is performed by using a gas mixture of $SF_6$, $O_2$, etc., and the $SF_6$ reacts with copper (Cu) of the drain electrode 23, thereby forming a copper compound such as $CuF_2$.

As shown in FIG. 5H, a transparent conductive metallic material 50 such as ITO is deposited on an entire surface of the array substrate 10, and then a photosensitive film pattern 65 is formed through a mask process.

As shown in FIG. 5I, part of the ITO is removed, through a wet etching, by using the photosensitive film pattern 65 as a mask. As a result, implemented is a pixel electrode formed of the ITO.

The ITO deposited on the drain electrode 23 is eroded when the pixel electrode 18 is patterned, since a bonding force with the drain electrode 23 has lowered due to the copper compound such as $CuF_2$ and $CuCl_2$ formed on the drain electrode 23 through the aforementioned back channel-etch and the dry strip.

The copper is used to form a data wire, e.g., a source electrode, a drain electrode and a data line, since it effectively serves as a low resistance wire. However, controlling the process is difficult since the copper is rapidly oxidized due to an excellent surface reactivity, or since the copper has a new coupling structure by reacting with another gas. Especially, in a case that the wire is formed of copper, a resistance may increase according to a surface state, or connection inferiority with ITO may occur.

SUMMARY OF THE INVENTION

Therefore, an aspect of the detailed description is to provide a method of fabricating a fringe field switching (FFS)-liquid crystal display (LCD) device which implements a high resolution and a wide viewing angle, the method capable of stably connecting a data wire formed of copper with a pixel electrode formed of ITO.

To achieve these and other advantages and in accordance with the purpose of this specification, as embodied and broadly described herein, there is provided a method of fabricating a fringe field switching (FFS)-liquid crystal display (LCD) device, comprising: forming a gate electrode and a gate line on a first substrate; forming a gate insulation film on the first substrate where the gate electrode and the gate line have been formed; forming an active layer, a source electrode and a drain electrode over the gate electrode and forming a data line which defines a pixel region by crossing the gate line through a single mask process; forming a pixel electrode electrically connected to the drain electrode through a single mask process; forming a passivation film on the first substrate where the pixel electrode has been formed; forming a common electrode formed in a single pattern over a pixel portion, and configured to generate a fringe field with a plurality of slits in each pixel region together with the pixel electrode; and bonding the first substrate to a second substrate, wherein an ohmic-contact layer is formed between the active layer and the source and drain electrodes by performing a back channel etching after the pixel electrode has been formed.

The step of forming the active layer, the source and drain electrodes, and the pixel electrode may include forming, on the gate insulation film, an amorphous silicon thin film, an n+ amorphous silicon thin film and a second conductive film; forming, on the second conductive film, first to third photosensitive film pattern; selectively removing the second conductive film by using the first to third photosensitive film patterns as a mask, thereby disposing a conductive film pattern formed of the second conductive film; selectively removing the amorphous silicon thin film and the n+ amorphous silicon thin film by using the first to third photosensitive film patterns as a mask, thereby disposing an active layer and an n+ amorphous silicon thin film pattern formed of the amorphous silicon thin film and the n+ amorphous silicon thin film, below the conductive film pattern; removing the third photosensitive film pattern through an ashing process, and forming fourth and fifth photosensitive film patterns having a thickness removed by a thickness of the third photosensitive film pattern; selectively removing the conductive film pattern by using the fourth and fifth photosensitive film patterns as a mask, thereby disposing source and drain electrodes formed of the second conductive film on the n+ amorphous silicon thin film pattern; removing the fourth and fifth photosensitive film patterns; forming a third conductive film on an entire surface of the first substrate; forming a photosensitive film pattern on the third conductive film; and selectively removing the third conductive film by using the photosensitive film pattern as a mask, thereby disposing a pixel electrode directly electrically connected to the drain electrode and formed of the third conductive film.

The second conductive film may have a multi-layer structure of at least two layers having thereon a low resistance opaque conductive material such as copper, a copper alloy and aluminum.

The third conductive film may be formed of a transparent conductive material of a high transmittance including indium-tin-oxide (ITO) or indium-zinc-oxide (IZO).

The fourth and fifth photosensitive film patterns may be removed through a wet strip process.

The method may further comprise removing the photosensitive film pattern through a wet strip process.

The method may further comprise forming an ohmic-contact layer between the active layer and the source and drain electrodes by selectively removing the n+ amorphous silicon thin film pattern.

The method may further comprise forming an ohmic-contact layer between the active layer and the source and drain electrodes by selectively removing the n+ amorphous silicon thin film pattern, with using the photosensitive film pattern as a mask.

The method may further comprise removing the photosensitive film pattern through a wet strip process.

According to another embodiment of this specification, there is provided a method of fabricating a fringe field switching (FFS)-liquid crystal display (LCD) device, comprising: forming a gate electrode and a gate line on a first substrate; forming a gate insulation film on the first substrate where the gate electrode and the gate line have been formed; forming, on the gate insulation film, an amorphous silicon thin film, an n+ amorphous silicon thin film, and a second conductive film; forming, on the second conductive film, first to third photosensitive film patterns; selectively removing the second conductive film by using the first to third photosensitive film patterns as a mask, thereby disposing a conductive film pattern formed of the second conductive film; selectively removing the amorphous silicon thin film and the n+ amorphous silicon thin film by using the first to third photosensitive film patterns as a mask, thereby disposing an active layer and an n+ amorphous silicon thin film pattern formed of the amorphous silicon thin film and the n+ amorphous silicon thin film, below the conductive film pattern; removing the third photosensitive film pattern through an ashing process, and forming fourth and fifth photosensitive film patterns having a thickness removed by a thickness of the third photosensitive film pattern; selectively removing the conductive film pattern by using the fourth and fifth photosensitive film patterns as a mask, thereby disposing source and drain electrodes formed of the second conductive film on the n+ amorphous silicon thin film pattern; selectively removing the n+ amorphous silicon thin film pattern through a dry etching using a plasma gas having $Cl_2$ removed therefrom, by using the fourth and fifth photosensitive film patterns as a mask, thereby disposing an ohmic-contact layer formed of the n+ amorphous silicon thin film; removing the fourth and fifth photosensitive film patterns; forming a third conductive film on an entire surface of the first substrate; forming a photosensitive film pattern on the third conductive film; selectively removing the third conductive film by using the photosensitive film pattern as a mask, thereby disposing a pixel electrode directly electrically connected to the drain electrode and formed of the third conductive film; forming a passivation film on the first substrate where the pixel electrode has been formed; forming a common electrode formed in a single pattern over a pixel portion, and configured to generate a fringe field with a plurality of slits in each pixel region together with the pixel electrode; and bonding the first substrate to a second substrate.

The method of fabricating an FFS-LCD device according to the present invention may have the following advantages.

Firstly, an inferior connection between the drain electrode and the pixel electrode may be prevented by preventing formation of a copper compound on the drain electrode, by performing a back channel etching after patterning a pixel electrode, and by performing a wet strip rather than a dry strip. This may result in a direct contact between copper and ITO, thereby reducing the number of mask processes.

That is, a back channel etching which reacts well with the surface of copper may be performed after ITO deposition, or gas such as $SF_6$ and $Cl_2$ used at the time of a dry etching may be controlled. This may allow a direct contact between copper and ITO.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Description will now be given in detail of the exemplary embodiments, with reference to the accompanying drawings. For the sake of brief description with reference to the drawings, the same or equivalent components will be provided with the same reference numbers, and description thereof will not be repeated.

Hereinafter, a method of fabricating a fringe field switching (FFS)-liquid crystal display (LCD) device according to the present invention will be explained in more detail with reference to the attached drawings.

Figure 1:
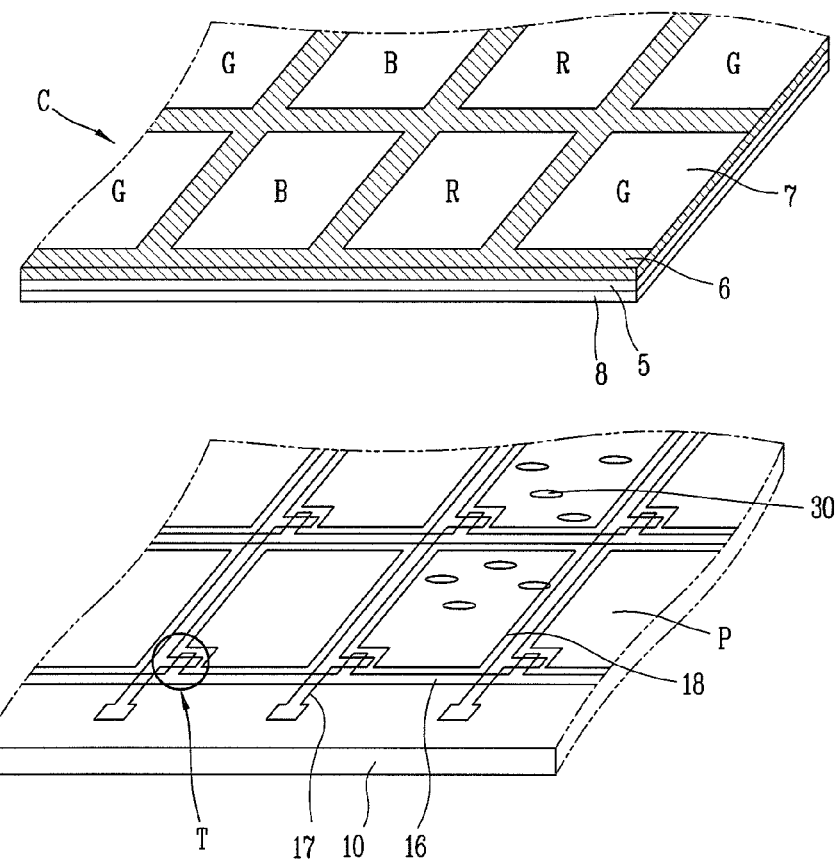
FIG. 1 is a disassembled perspective view schematically showing a structure of a liquid crystal display (LCD) device in accordance with the related art.
Figure 2:
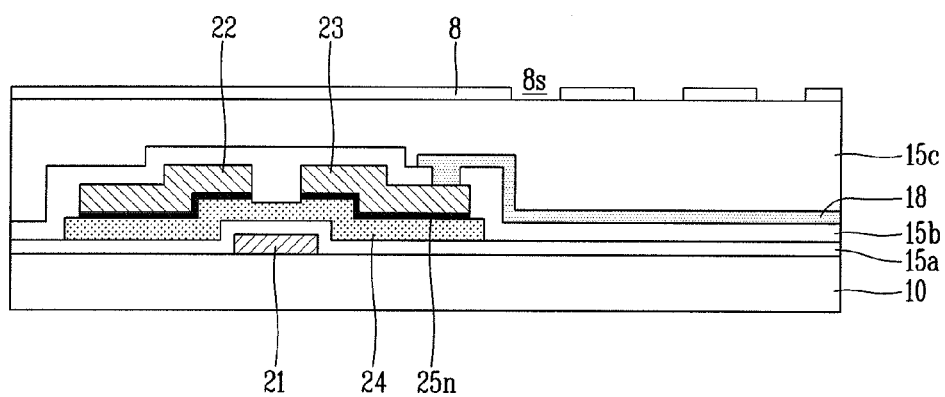
FIGS. 2 and 3 are sectional views schematically showing part of an array substrate of a fringe field switching (FFS)-liquid crystal display (LCD) device in accordance with the related art.
Figure 3:
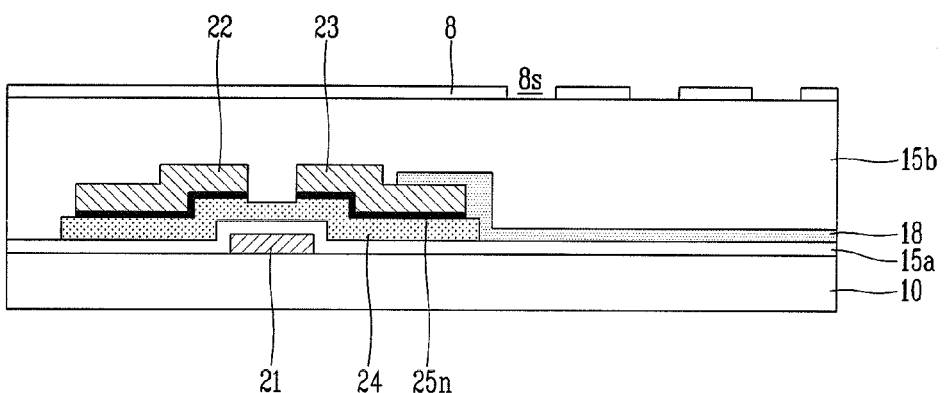
Figure 4A:
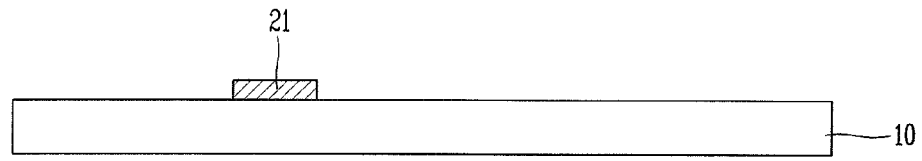
FIGS. 4A to 4E are sectional views sequentially showing processes of fabricating the array substrate of FIG. 3.
Figure 4B:
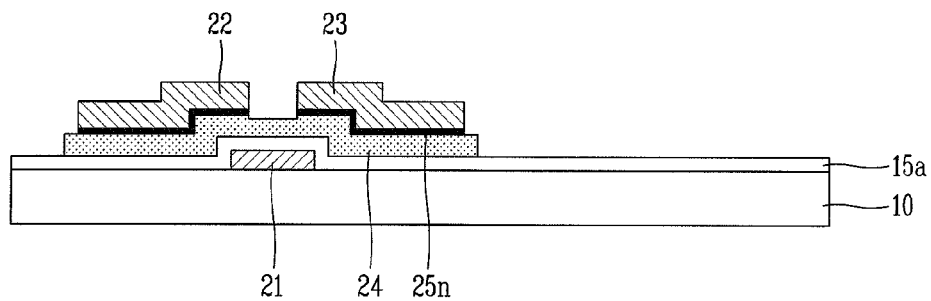
Figure 4C:
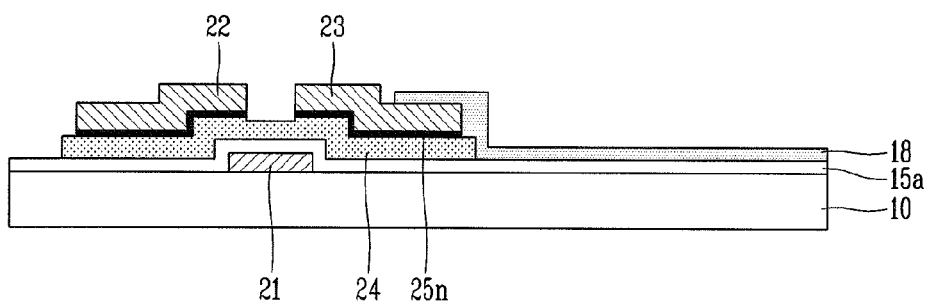
Figure 4D:
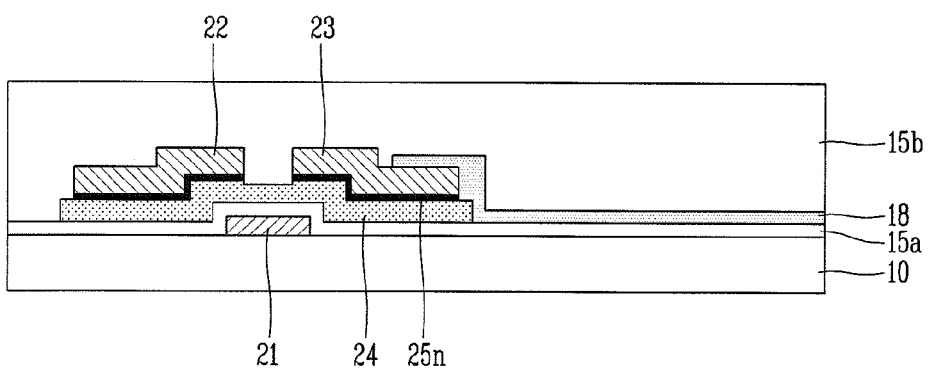
Figure 4E:
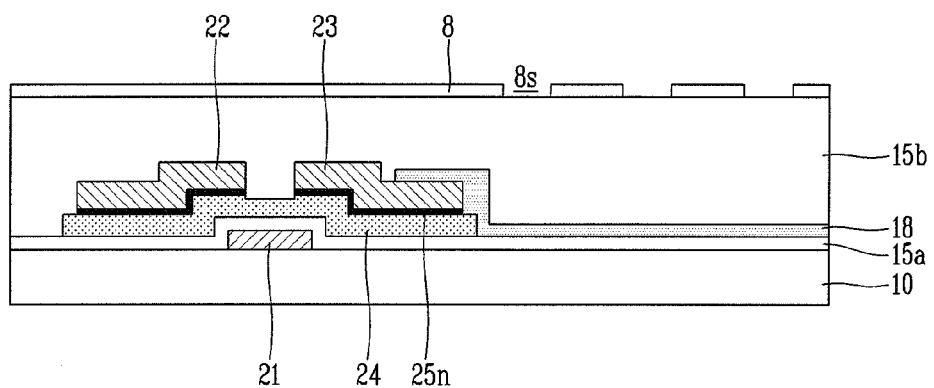
Figure 5A:
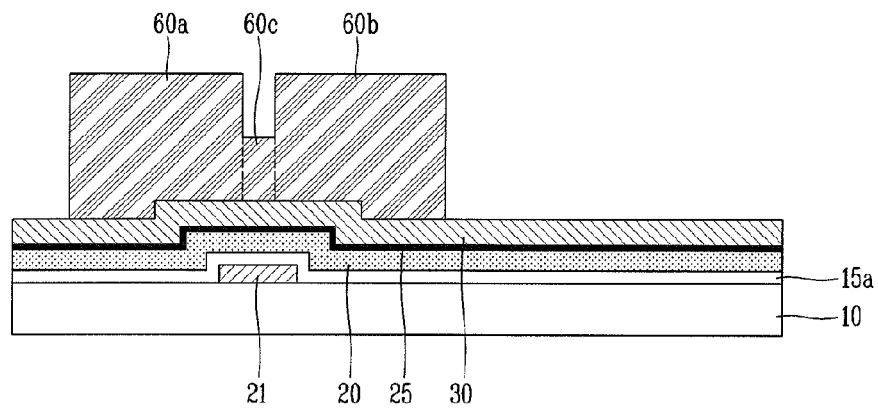
FIGS. 5A to 5I are sectional views showing a second mask process and a third mask process of FIGS. 4B and 4C in detail.
Figure 5B:
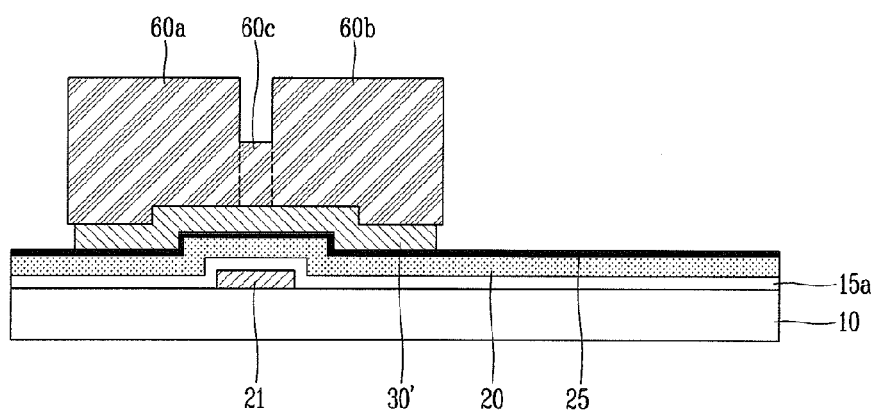
Figure 5C:
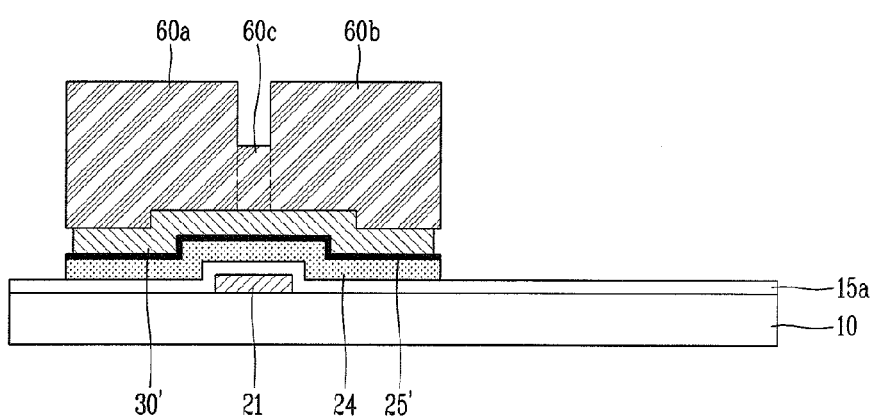
Figure 5D:
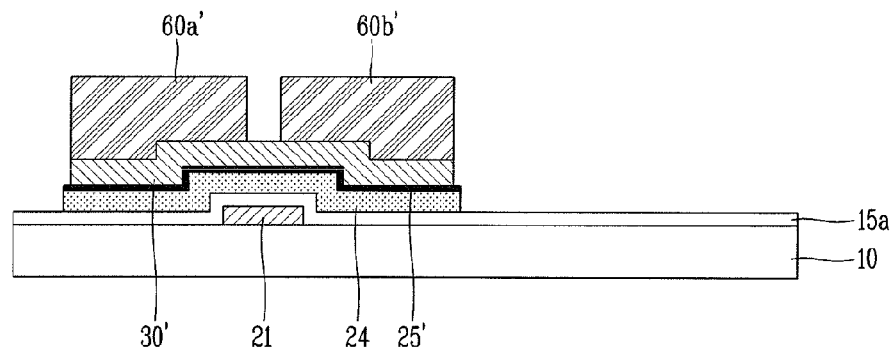
Figure 5E:
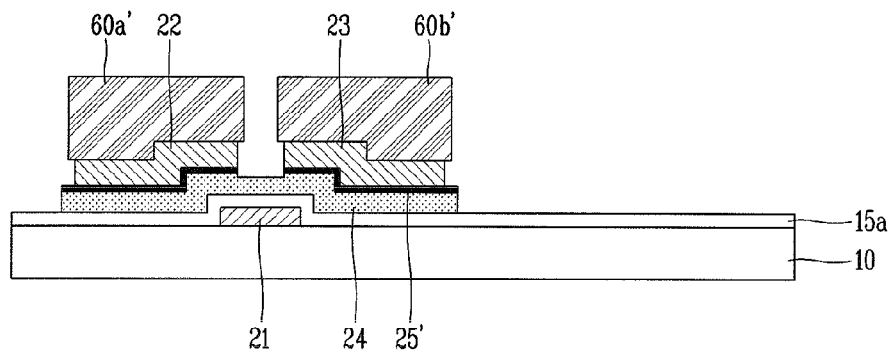
Figure 5F:
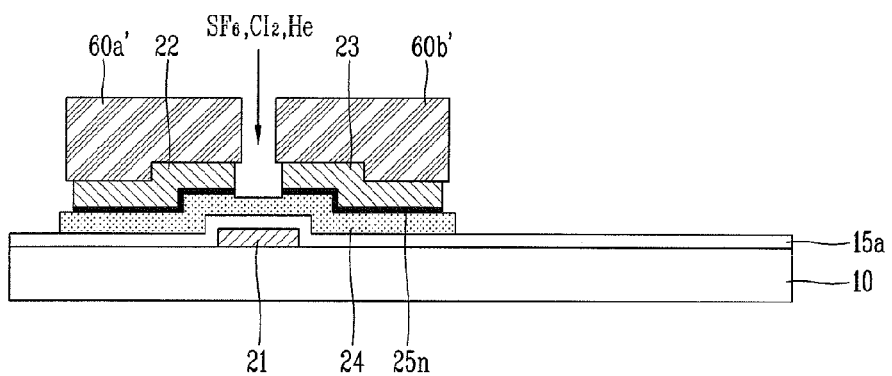
Figure 5G:
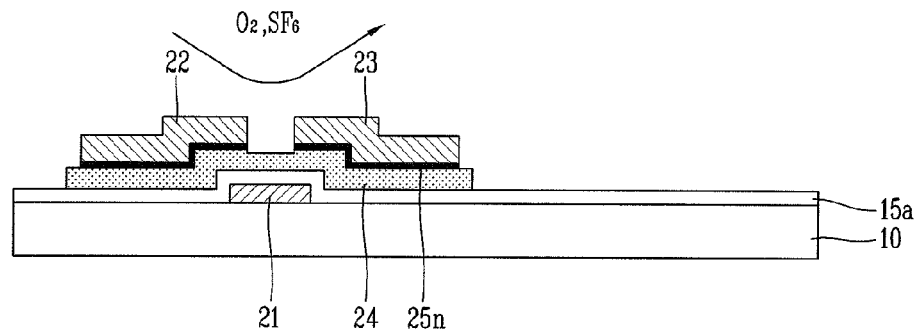
Figure 5H:
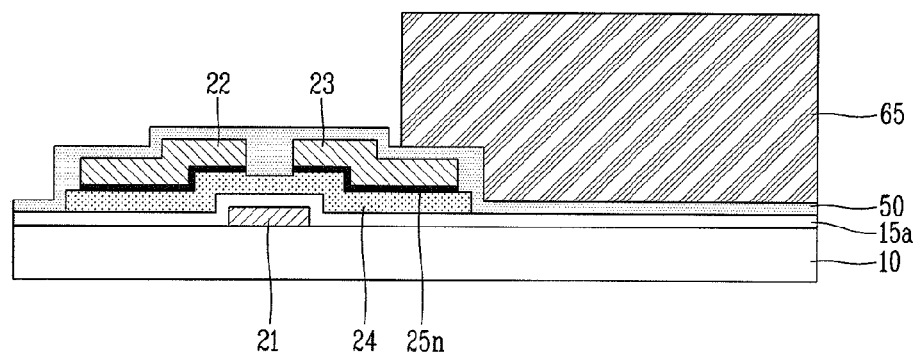
Figure 5I:
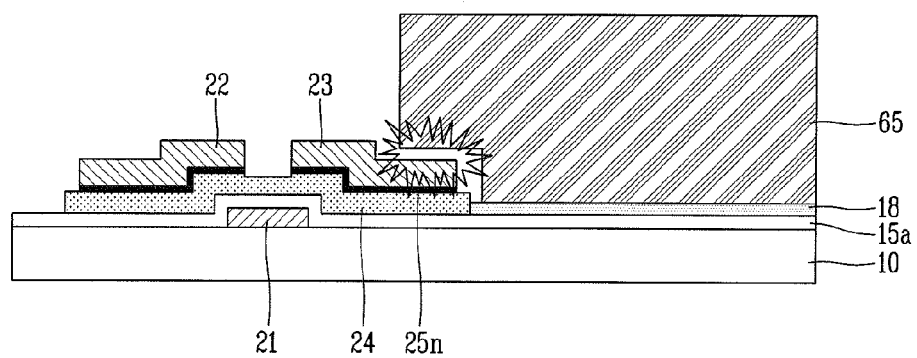
Figure 6:
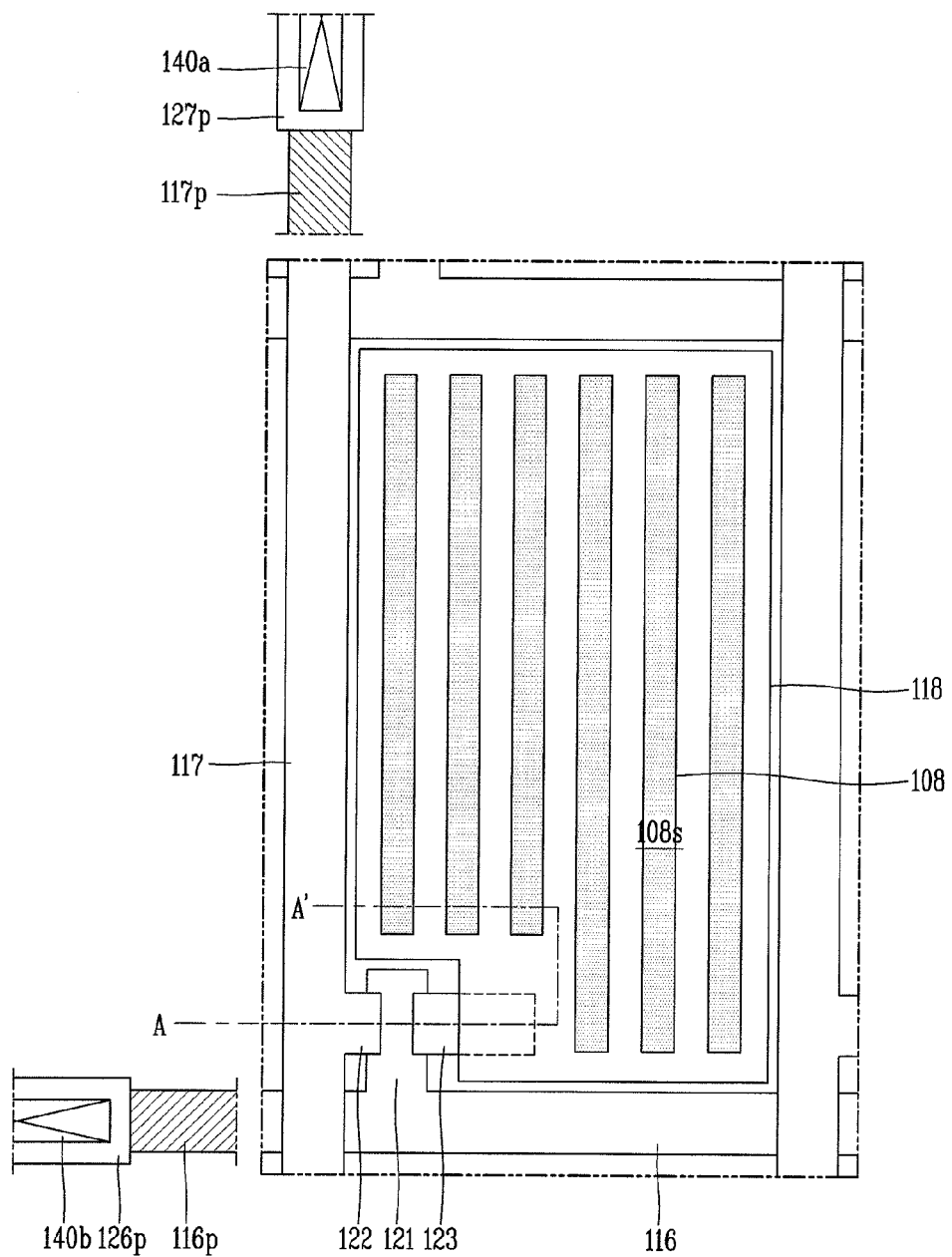
FIG. 6 is a planar view schematically showing part of an array substrate of a fringe field switching (FFS)-liquid crystal display (LCD) device according to a first embodiment of the present invention.

FIG. 6 is a planar view schematically showing part of an array substrate of a fringe field switching (FFS)-liquid crystal display (LCD) device according to a first embodiment of the present invention. Referring to FIG. 6, the FFS-LCD device implements an image by driving liquid crystal molecules disposed on a pixel region and a pixel electrode, by allowing a fringe field formed between the pixel electrode and a common electrode to penetrate through slits.

For convenience, FIG. 6 shows one pixel including a pixel portion, a data pad portion and a gate pad portion. However, an LCD device actually has N×M pixels as N gate lines and M data lines cross each other.

Figure 7:
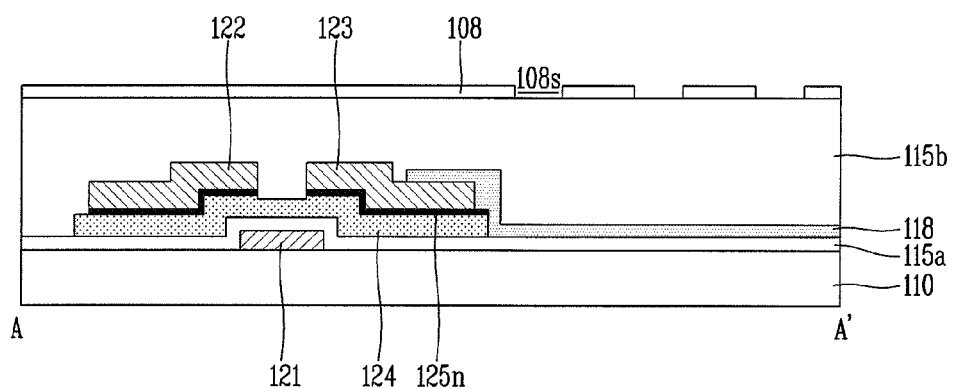
FIG. 7 is a sectional view schematically showing part of an array substrate of a fringe field switching (FFS)-liquid crystal display (LCD) device according to a first embodiment of the present invention.

FIG. 7 is a sectional view schematically showing part of an array substrate of a fringe field switching (FFS)-liquid crystal display (LCD) device according to a first embodiment of the present invention, which is a view taken along line A-A' of the array substrate of FIG. 6.

As shown in FIGS. 6 and 7, on the array substrate 110 according to one embodiment of the present invention, formed are gate lines 116 and data lines 117 which define pixel regions by being arranged horizontally and vertically. A switching device, a thin film transistor (TFT) is formed at each intersection between the gate lines 116 and the data lines 117. In the pixel region, formed are a pixel electrode 118 and a common electrode 108 having a plurality of slits 108s, each electrode for driving LC molecules by generating a fringe field, The TFT consists of a gate electrode 121 connected to the gate line 116, a source electrode 122 connected to the data line 117, and a drain electrode 123 electrically connected to the pixel electrode 118. And, the TFT includes a gate insulation film 115a for insulating the gate electrode 121 from the source and drain electrodes 122 and 123, and an active layer 124 for forming a conductive channel between the source electrode 122 and the drain electrode 123 by a gate voltage supplied to the gate electrode 121.

Source and drain regions of the active layer 124 form ohmic contacts together with the source electrode 122 and the drain electrode 123, through an ohmic contact layer 125n.

Part of the source electrode 122 is extending to one direction, thereby being connected to the data line 117. And, part of the drain electrode 123 is extending to the pixel region, thereby being directly and electrically connected to the pixel electrode 118.

As aforementioned, in the pixel region, formed are the common electrode 108 and the pixel electrode 118 each for generating a fringe field. The common electrode 108 is formed in a single pattern over an entire region of the pixel portion, and is formed to have a plurality of slits 108s in each pixel region. The pixel electrode 118 is formed in a box shape in each pixel region.

On edge regions of the array substrate 110, formed are a gate pad electrode 126p and a data pad electrode 127p electrically connected to the gate line 116 and the data line 117, respectively, and configured to transmit a scan signal and a data signal received from an external driving circuit (not shown) to the gate line 116 and the data line 117.

That is, the gate line 116 and the data line 117 are extending toward the driving circuit, thereby being connected to a gate pad line 116p and a data pad line 117p. And, the gate pad line 116p and the data pad line 117p receive a scan signal and a data signal from the driving circuit, respectively, through the gate pad electrode 126p and the data pad electrode 127p electrically connected thereto.

The data pad line 117p is electrically connected to the data pad electrode 127p through a first contact hole 140a, and the gate pad line 116p is electrically connected to the gate pad electrode 126p through a second contact hole 140b.

In the FFS-LCD device according to the first embodiment of the present invention, the pixel electrode is formed on the drain electrode for connection therebetween without a contact hole. This may allow a single mask process to be omitted.

Furthermore, an inferior connection between the drain electrode and the pixel electrode is minimized by preventing formation of a copper compound on the drain electrode, by performing a back channel etching after patterning a pixel electrode, and by performing a wet strip rather than a dry strip. Especially, the back channel etching is performed after wet-stripping a pixel electrode.

In the FFS-LCD device according to the first embodiment of the present invention, the number of mask processes is reduced by a single process, and the pixel electrode formed of ITO is disposed on the drain electrode for direct contact therebetween. Here, inferior erosion of ITO may be solved by performing a back channel etching after ITO deposition, the back channel etching using $SF_6$ and $Cl_2$ reacted on the surface of copper as a reaction gas.

Hereinafter, a method of fabricating an FSS-LCD device according to the first embodiment of the present invention will be explained in more details with reference to the attached drawings.

FIGS. 8A to 8E are sectional views sequentially showing processes of fabricating the array substrate of FIG. 6, and FIGS. 9A to 9E are sectional views sequentially showing processes of fabricating the array substrate of FIG. 7.

Figure 8A:
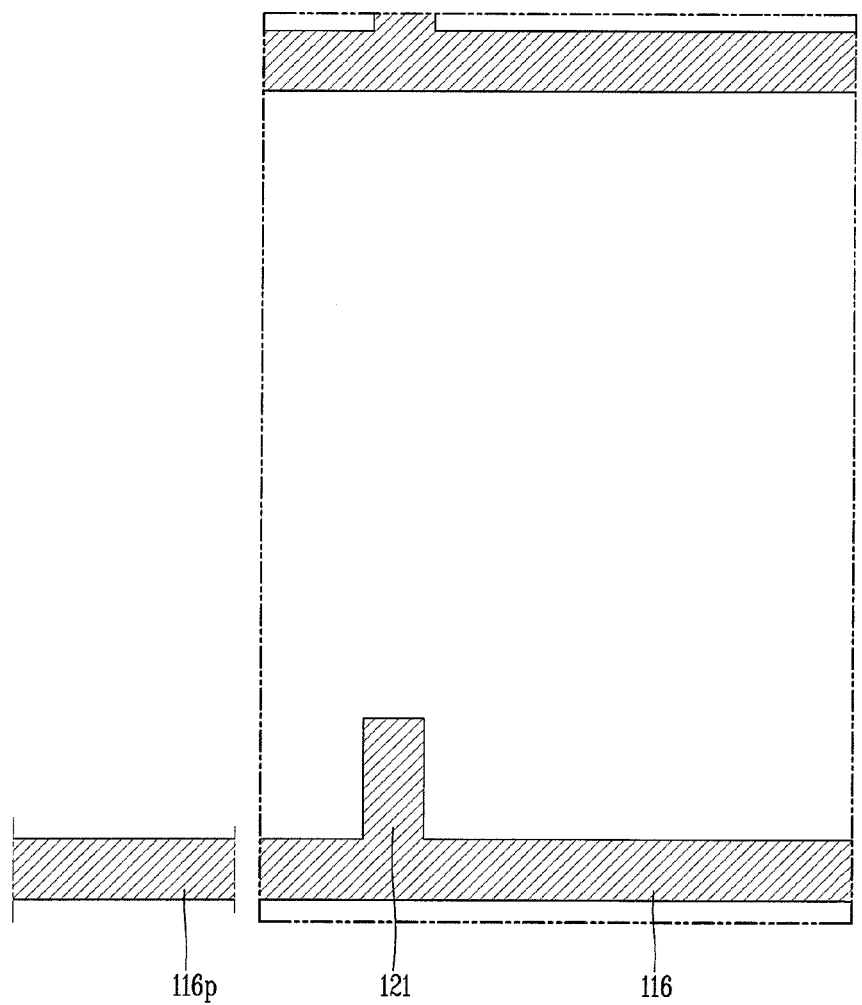
FIGS. 8A to 8E are sectional views sequentially showing processes of fabricating the array substrate of FIG. 6.
Figure 9A:
FIGS. 9A to 9E are sectional views sequentially showing processes of fabricating the array substrate of FIG. 7.

As shown in FIGS. 8A and 9A, on the pixel portion of the array substrate 110 formed of a transparent insulating material such as glass, formed are a gate electrode 121 and a gate line 116. And, a gate pad line 116p is formed on a gate pad portion of the array substrate 110.

The gate electrode 121, the gate line 116 and the gate pad line 116p are formed by depositing a first conductive film on an entire surface of the array substrate 110, and then by selectively patterning the first conductive film through a photolithography process (first mask process).

The first conductive film may be formed of a low resistance opaque conductive material such as aluminum (Al), Al alloy, tungsten (W), copper (Cu), chrome (Cr), molybdenum (Mo) and Mo alloy. Alternatively, the first conductive film may have a multi-layered structure in which at least two of the low resistance conductive materials are laminated.

Figure 8B:
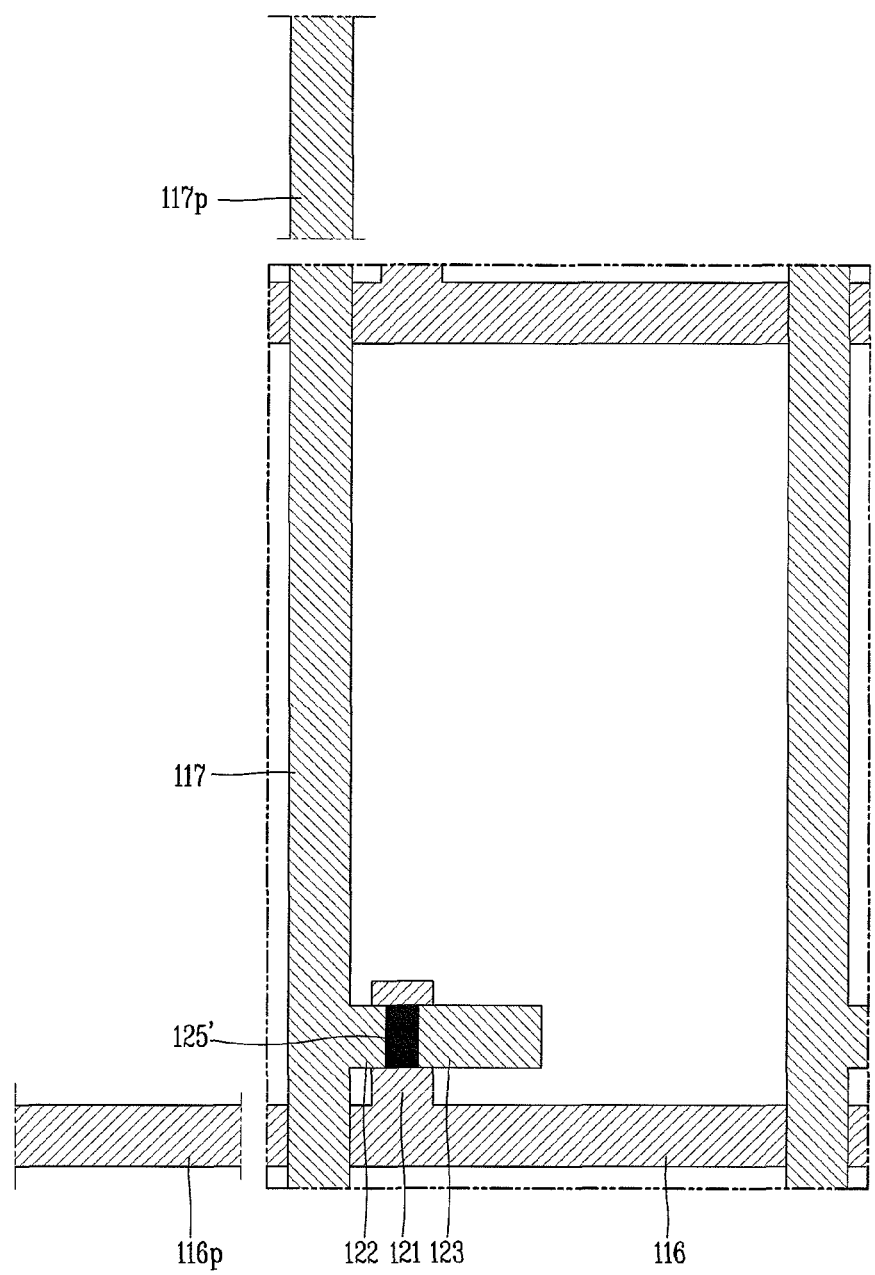
Figure 9B:
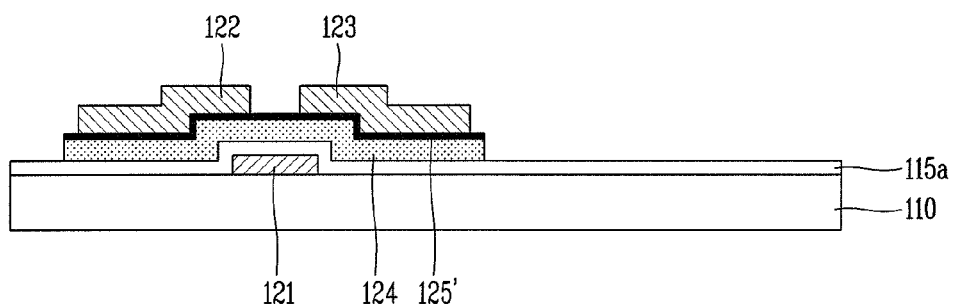

As shown in FIGS. 8B and 9B, on an entire surface of the array substrate 110 where the gate electrode 121, the gate line 116 and the gate pad line 116p have been formed, formed are a gate insulation film 115a, an amorphous silicon thin film, an n+ amorphous silicon thin film and a second conductive film. The second conductive film may have a multi-layered structure in which at least two low resistance opaque conductive materials such as copper, copper alloy and aluminum are laminated, so as to form a source electrode, a drain electrode and a data line.

Then, the amorphous silicon thin film, the n+ amorphous silicon thin film and the second conductive film are selectively removed through a photolithography process (second mask process). As a result, an active layer 124 formed of the amorphous silicon thin film is formed in the pixel portion of the array substrate 110, and a source electrode 122 and a drain electrode 123 formed of the second conductive film are formed on the active layer 124.

A data line 117 which defines a pixel region together with the gate line 116 is formed, through the second mask process, in the pixel portion of the array substrate 110. And, a data pad line 117p formed of the second conductive film is disposed in a data pad portion of the array substrate 110.

On the active layer 124, formed is an n+ amorphous silicon thin film pattern 125' patterned in the same manner as the active layer 124.

Figure 8C:
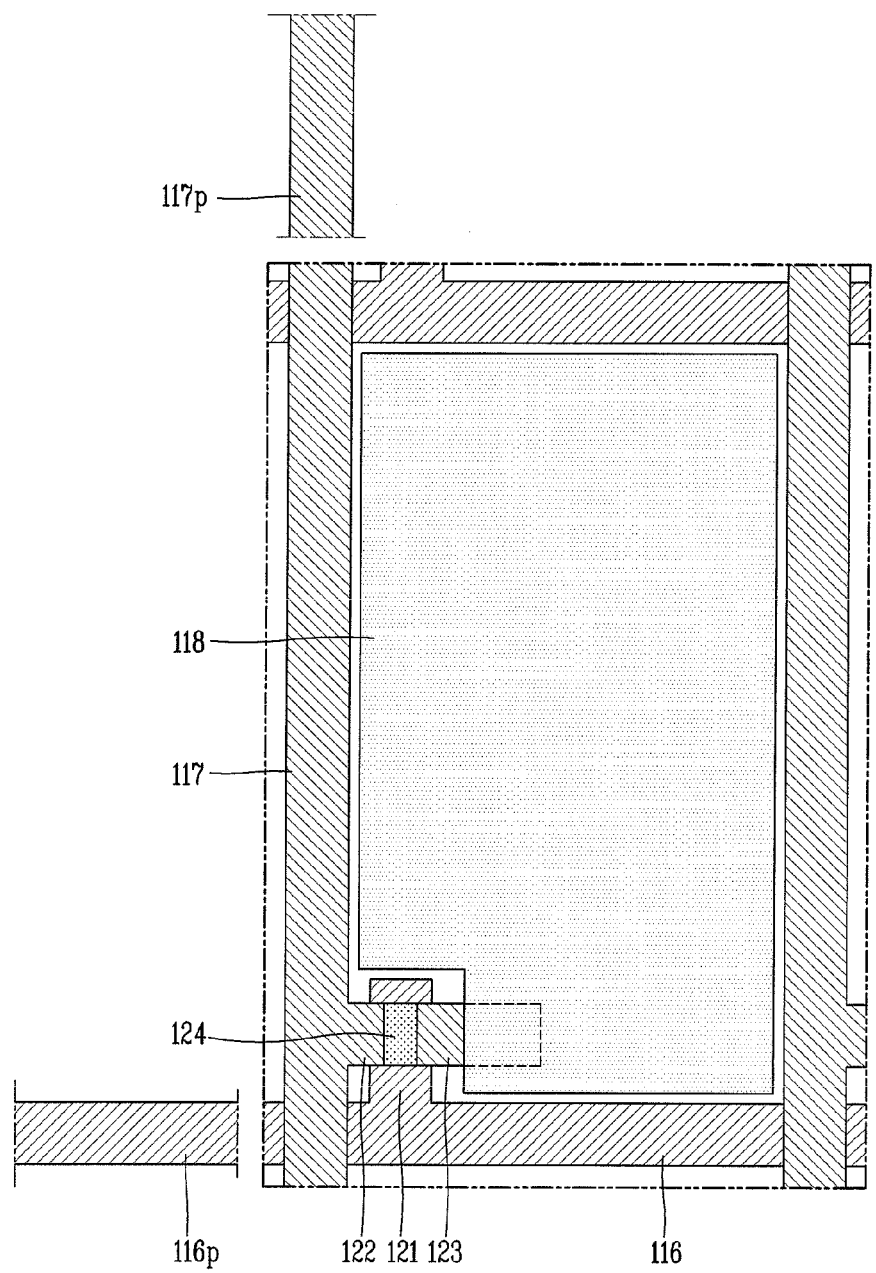
Figure 9C:
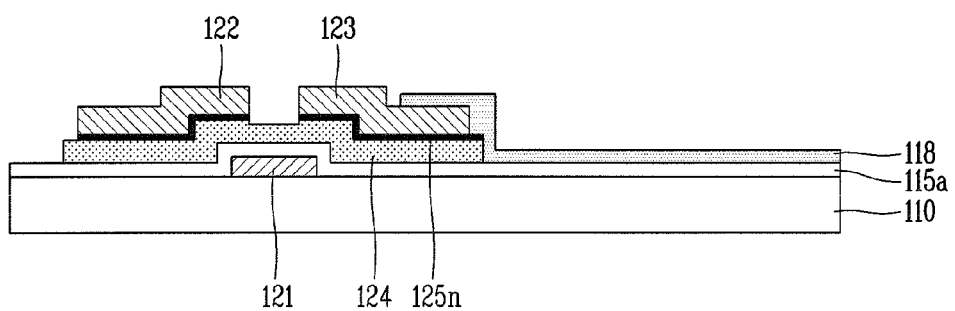

As shown in FIGS. 8C and 9C, a third conductive film is formed on an entire surface of the array substrate 110 where the active layer 124, the source electrode 122, the drain electrode 123 and the data line 117 have been formed. In order to form a pixel electrode, the third conductive film may be formed of a transparent conductive material of a high transmittance such as indium tin oxide (ITO) or indium zinc oxide (IZO).

Then, the third conductive film is selectively removed through a photolithography process (third mask process), thereby forming, in the pixel region, a pixel electrode 118 formed of the third conductive film and electrically connected to the drain electrode 123.

The n+ amorphous silicon thin film is selectively removed through the third mask process, thereby forming an ohmic-contact layer 125n which ohmic-contacts source and drain regions of the active layer 124 with the source and drain electrodes 122 and 123.

Hereinafter, the second mask process and the third mask process will be explained in more details with reference to the attached drawings.

FIGS. 10A to 10L are sectional views showing, in detail, the second mask process and the third mask process of FIGS. 9B and 9C according to a first embodiment of the present invention.

Figure 10A:
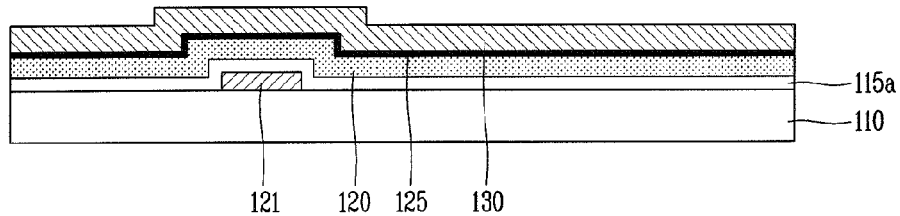
FIGS. 10A to 10L are sectional views showing, in detail, a second mask process and a third mask process of FIGS. 9B and 9C according to a first embodiment of the present invention.

As shown in FIG. 10A, on an entire surface of the array substrate 110 where the gate electrode 121, the gate line 116 and the gate pad line 116 have been formed, sequentially deposited are a gate insulation film 115a, an amorphous silicon thin film 120, an n+ amorphous silicon thin film 125 and a second conductive film 130.

As aforementioned, the second conductive film 130 may have a multi-layered structure in which at least two low resistance opaque conductive materials such as copper, copper alloy and aluminum are laminated, so as to form a source electrode, a drain electrode and a data line.

Figure 10B:
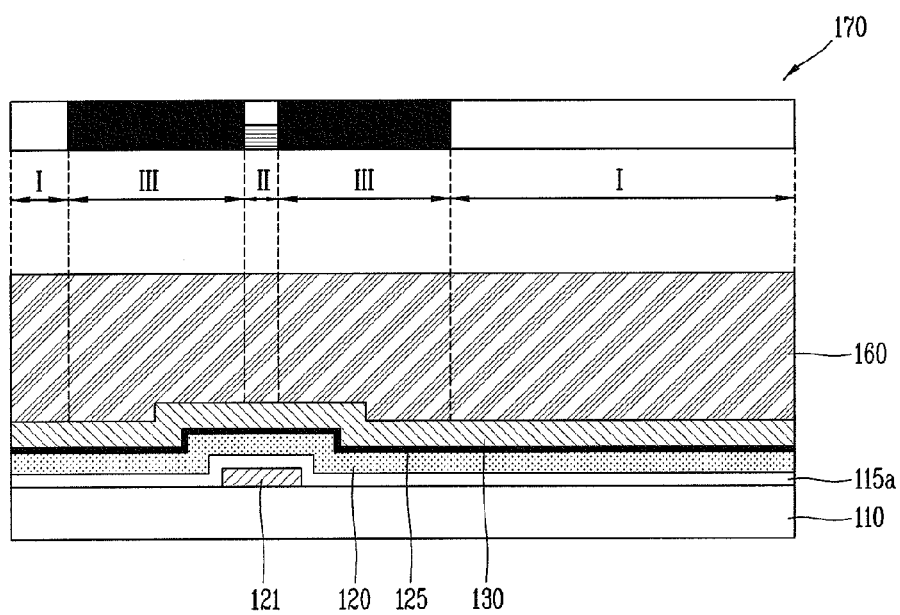

As shown in FIG. 10B, a photosensitive film 160 formed of a photosensitive material such as a photoresist is formed on the array substrate 110 where the second conductive film 130 has been formed. Then, light is selectively irradiated onto the photosensitive film 160 through a half-tone mask 170 or a diffraction mask according to the first embodiment of the present invention. Hereinafter, it is assumed that the half-tone mask includes the diffraction mask.

The half-tone mask 170 includes a first transmission region (I) for transmitting all of irradiated light, a second transmission region (II) for transmitting some of irradiated light and shielding others of the irradiated light, and a shielding region (III) for shielding all of irradiated light. Only light having passed through the half-tone mask 170 is irradiated onto the photosensitive film 160.

Figure 10C:
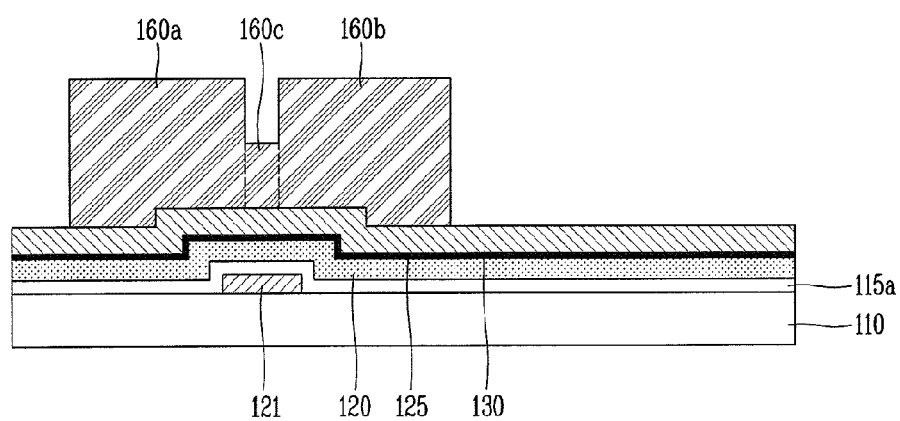

Then, the photosensitive film 160 having been exposed to light through the half-tone mask 170 is developed. As a result, as shown in FIG. 10C, a first photosensitive film pattern 160a to a third photosensitive film pattern 160c having predetermined thicknesses remain in the shielding region (III) and the second transmission region (II) where light has been shielded completely or partially. And, the photosensitive film 160 is completely removed in the first transmission region (I), thereby exposing the surface of the second conductive film 130.

The first photosensitive film pattern 160a and the second photosensitive film pattern 160b formed in the shielding region (III) have a thickness thicker than that of the third photosensitive film pattern 160c formed in the second transmission region (II). And, the photosensitive film is completely removed in the first transmission region (I) since a positive type of photoresist has been used. However, the present invention is not limited to this. That is, a negative type of photoresist may be used.

Figure 10D:
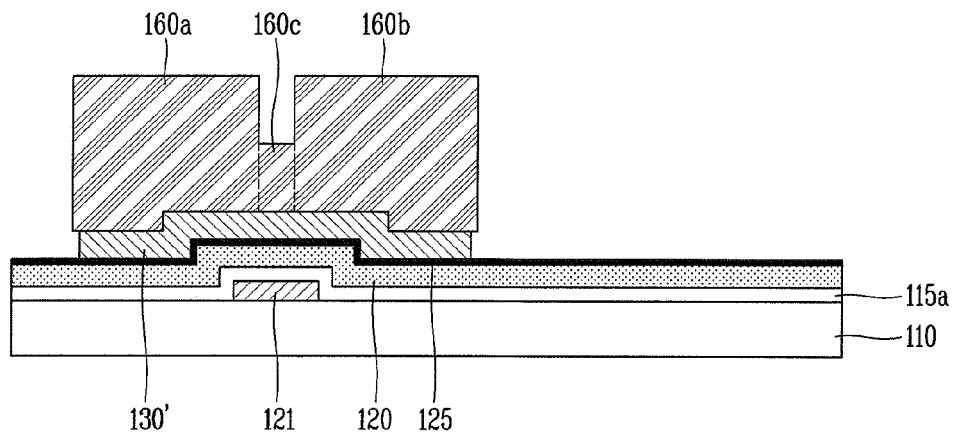

As shown in FIG. 10D, part of the second conductive film is selectively removed, through a wet etching, by using the first photosensitive film pattern 160a to the third photosensitive film pattern 160c as a mask. As a result, a conductive film pattern 130' formed of the second conductive film is disposed in the pixel portion of the array substrate 110.

Figure 10E:
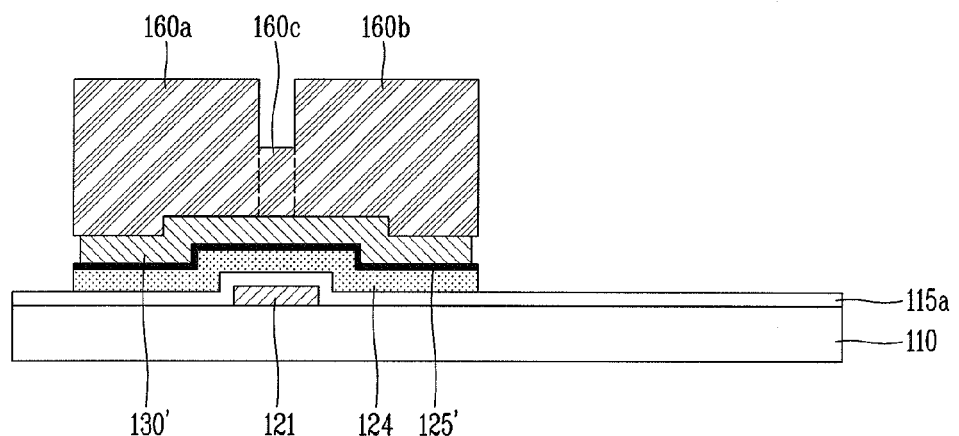

As shown in FIG. 10E, parts of the amorphous silicon thin film and the n+ amorphous silicon thin film are selectively removed, through a dry etching, by using the first photosensitive film pattern 160a to the third photosensitive film pattern 160c as a mask. As a result, an active layer 124 and an n+ amorphous silicon thin film pattern 125' formed of the amorphous silicon thin film and the n+ amorphous silicon thin film are disposed below the conductive film pattern 130', respectively.

Figure 10F:
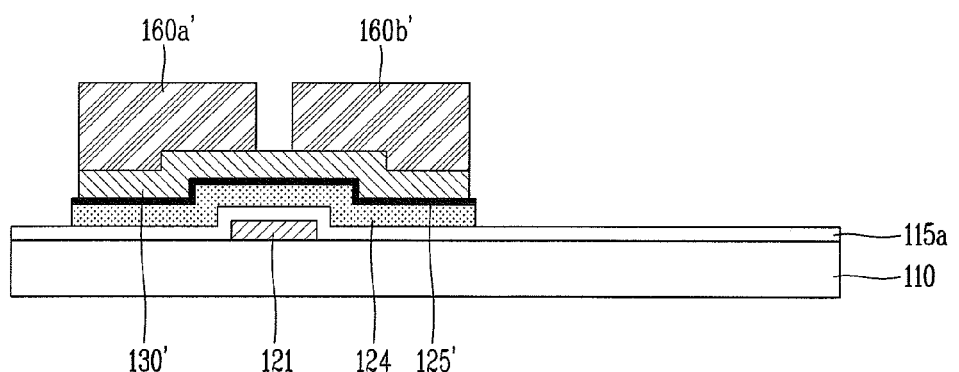

Then, an ashing process is performed to remove part of the thicknesses of the first photosensitive film pattern 160a to the third photosensitive film pattern 160c. As a result, as shown in FIG. 10F, the third photosensitive film pattern in the second transmission region (II) is completely removed.

The first photosensitive film pattern 160a and the second photosensitive film pattern 160b undergo a process for removing a thickness by a thickness of the third photosensitive film pattern 160c, thereby remaining in the shielding region (III) as a fourth photosensitive film pattern 160a' and a fifth photosensitive film pattern 160b'.

Figure 10G:
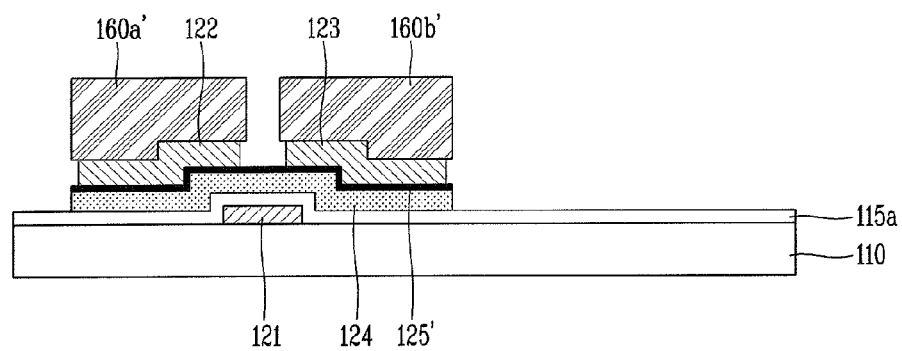

As shown in FIG. 10G, part of the conductive film pattern is selectively removed, through a wet etching, by using the fourth photosensitive film pattern 160a' and the fifth photosensitive film pattern 160b' as a mask. As a result, a source electrode 122 and a drain electrode 123 formed of the second conductive film are disposed on the n+ amorphous silicon thin film pattern 125'. Although not shown, in the pixel portion of the array substrate 110, disposed is a data line which defines a pixel region together with the gate line 116 and formed of the second conductive film. And, a data pad line formed of the second conductive film is disposed in a data pad portion of the array substrate 110.

Figure 10H:
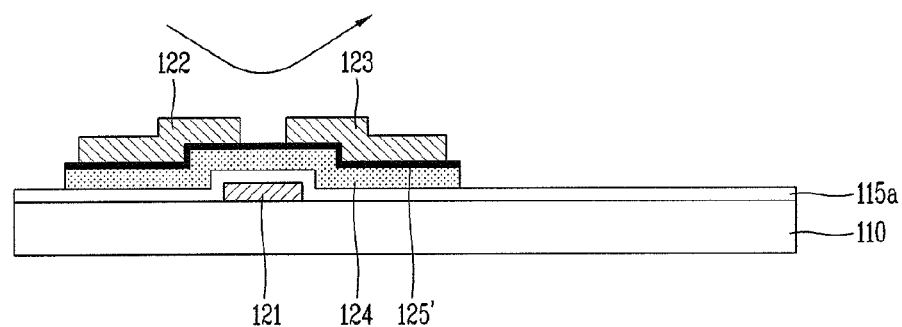

As shown in FIG. 10H, the fourth photosensitive film pattern 160a' and the fifth photosensitive film pattern 160b' are removed through a wet strip process.

In the first embodiment of the present invention, ITO erosion may be prevented by using a wet strip, rather than a dry strip using a gas such as $SF_6$ which reacts with copper. For reference, as an analysis result on the surface of copper using a secondary ion mass spectrometry (SIMS), an F-based compound has a higher content ratio in a condition of a dry strip, than in a condition of a wet strip.

Figure 10I:
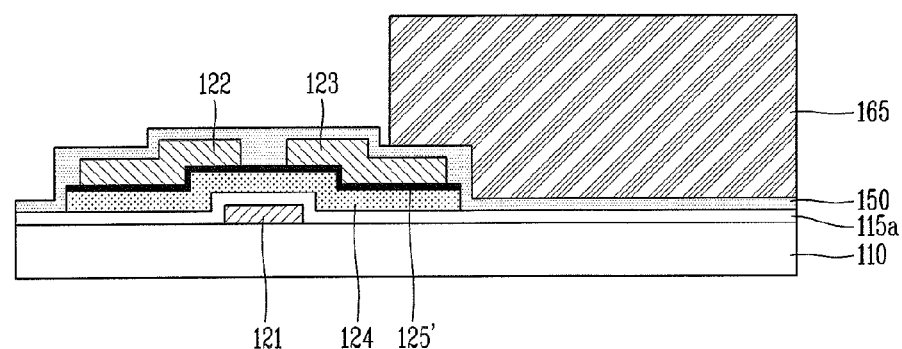

As shown in FIG. 10I, a third conductive film 150 is deposited on an entire surface of the array substrate 110, and then a photosensitive film pattern 165 is formed thereon through a mask process. The third conductive film 150 may be formed of a transparent conductive material of a high transmittance such as ITO or IZO, so as to form a pixel electrode.

Figure 10J:
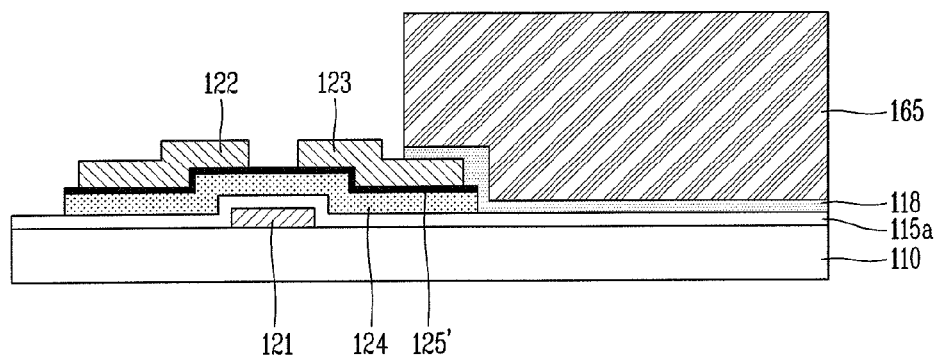

As shown in FIG. 10J, part of the third conductive film is selectively removed, through a wet etching, by using the photosensitive film pattern 165 as a mask. As a result, implemented is a pixel electrode 118 formed of the third conductive film and directly and electrically connected to the drain electrode 123.

Figure 10K:
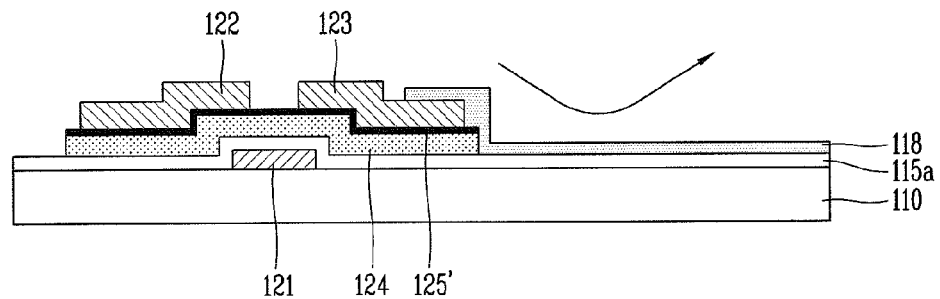

As shown in FIG. 10K, the photosensitive film pattern 165 is removed through a wet strip process.

Figure 10L:
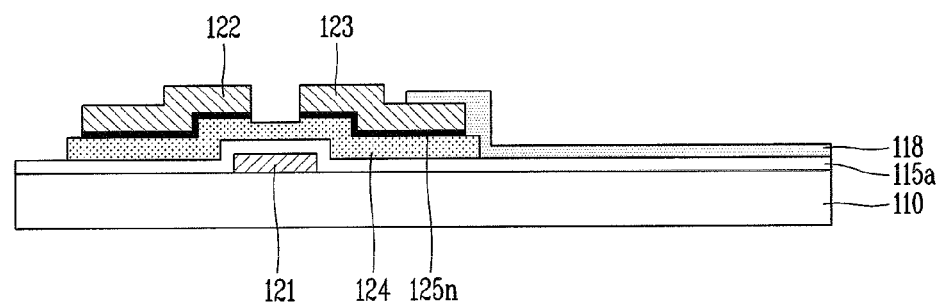

As shown in FIG. 10L, part of the n+ amorphous silicon thin film pattern is selectively removed (back channel-etched) through a dry etching. As a result, implemented is an ohmic-contact layer 125n formed of the n+ amorphous silicon thin film.

In this case, an inferior connection between the drain electrode 123 and the pixel electrode 118 does not occur even if a dry etching is used for the back channel-etching. The reason is because the pixel electrode 118 has been already formed on the drain electrode 123.

Figure 8D:
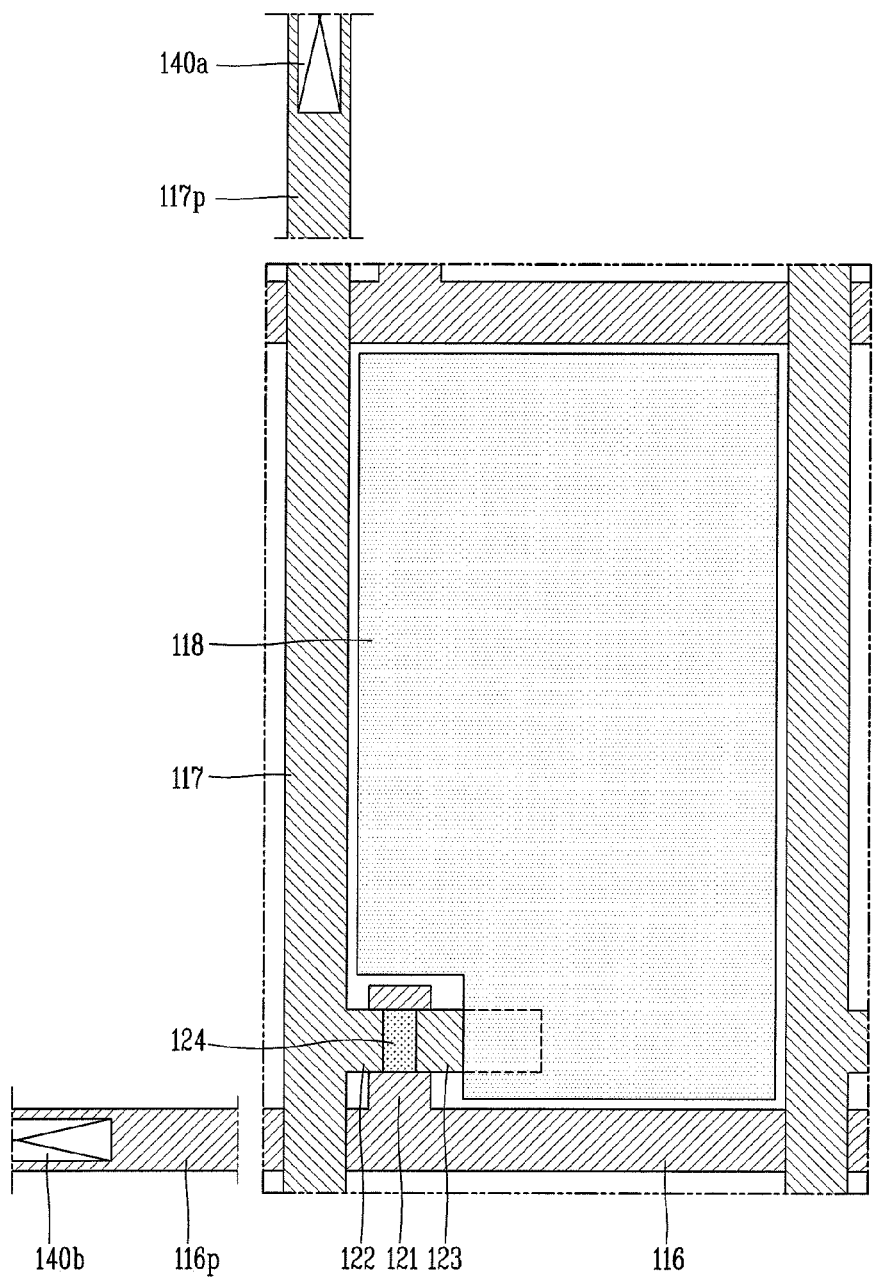
Figure 9D:
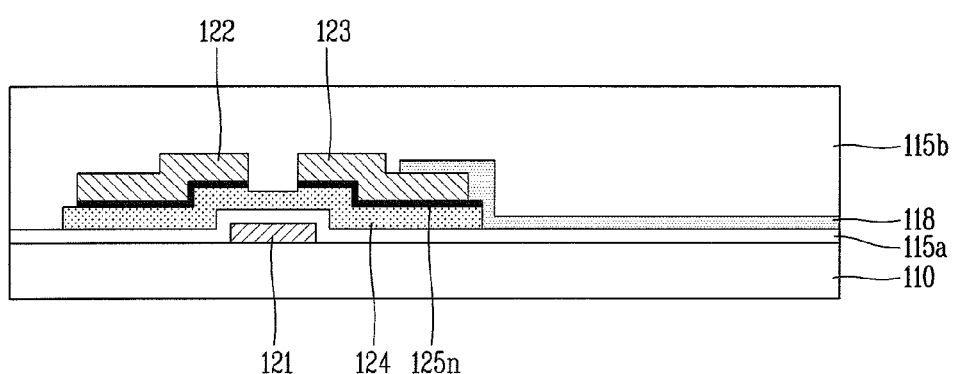

After the pixel electrode 118 has been formed, as shown in FIGS. 8D and 9D, a passivation film 115b is formed on an entire surface of the array substrate 110.

The passivation film 115b may be formed of an inorganic insulating film such as SiNx and $SiO_2$, or may be formed of an organic insulating film such as photo acryl.

Then, the gate insulation film 115a and the passivation film 115b are selectively removed through a photolithography process (fourth mask process). As a result, a first contact hole 140a and a second contact hole 140b which expose part of the data pad line 117p and the gate pad line 116p, respectively are formed at a data pad portion and a gate pad portion of the array substrate 110.

Figure 8E:
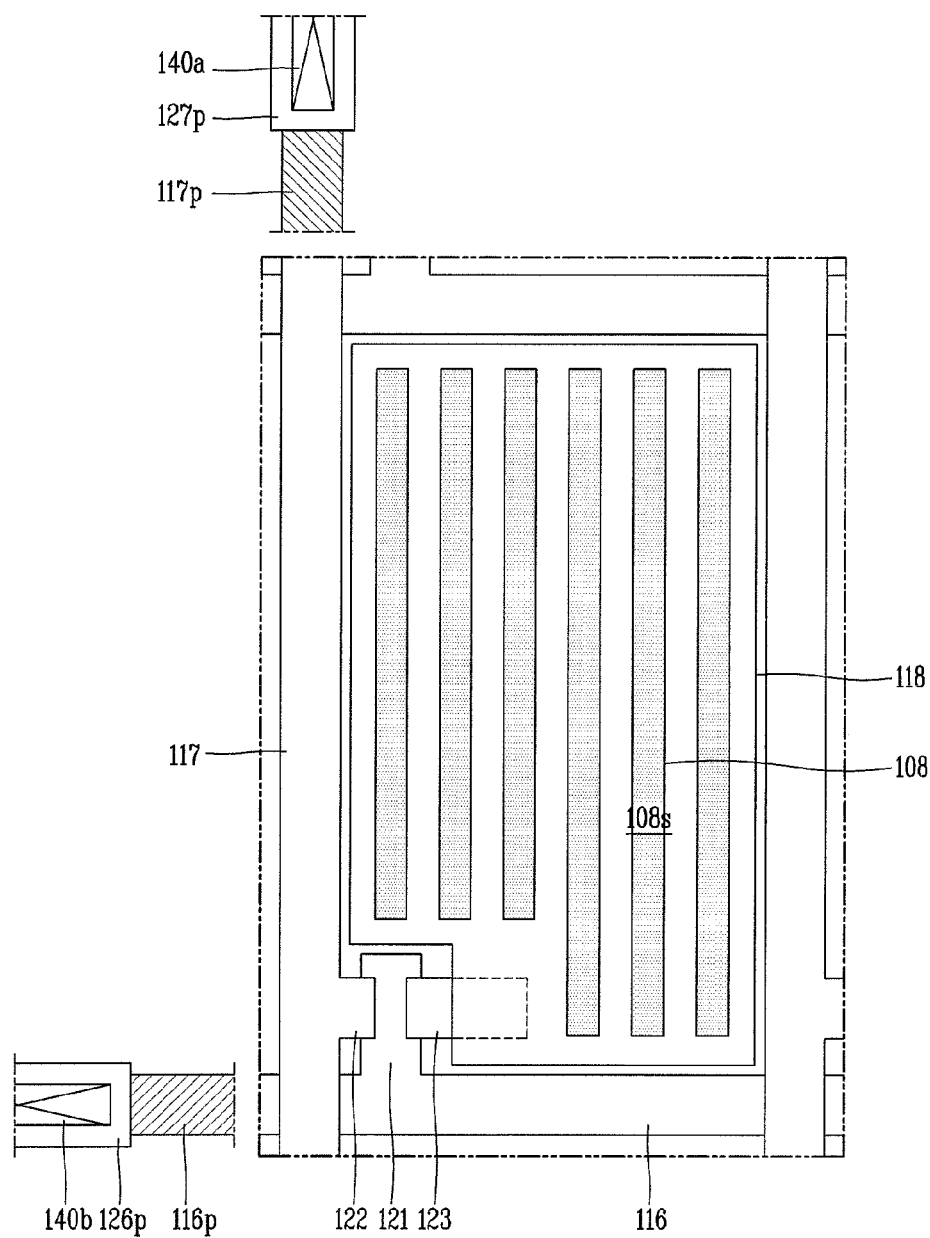
Figure 9E:
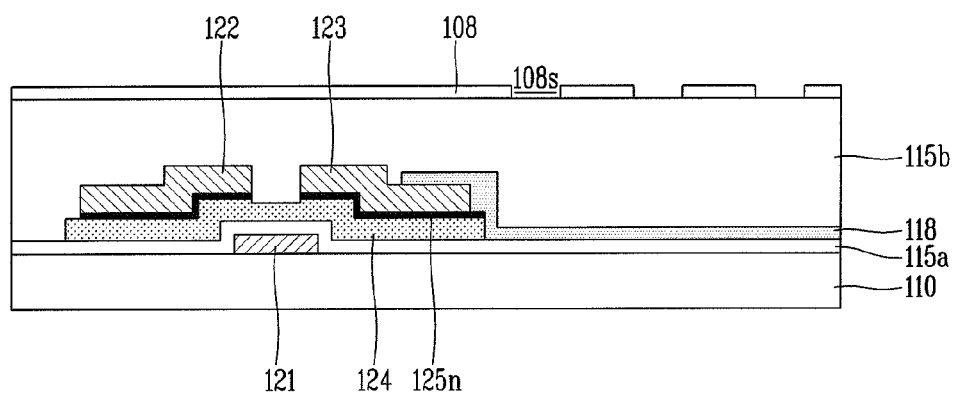

As shown in FIGS. 8E and 9E, a fourth conductive film is formed on an entire surface of the array substrate 110 where the passivation film 115b has been formed. Then, the fourth conductive film is selectively removed through a photolithography process (fifth mask process). As a result, a common electrode 108 formed of the fourth conductive film is disposed in the pixel portion of the array substrate 110.

The fourth conductive film is selectively removed through the fourth mask process. As a result, a data pad electrode 127p and a gate pad electrode 126p electrically connected to the data pad line 117p and the gate pad line 116p through the first contact hole 140a and the second contact hole 140b are formed at the data pad portion and the gate pad portion, respectively.

The fourth conductive film may be formed of a transparent conductive material of a high transmittance such as ITO or IZO, so as to form the common electrode 108, the data pad electrode 127p and the gate pad electrode 126p.

The common electrode 108 is formed in a single pattern over the pixel portion, and includes a plurality of slits 108s therein so as to generate a fringe field together with the pixel electrode 118.

In the FFS-LCD device according to the first embodiment of the present invention, a back channel etching is performed after wet-stripping the pixel electrode. However, the present invention is not limited to this. That is, the back channel etching may be performed before wet-stripping the pixel electrode, which will be explained in more details in a second embodiment of the present invention.

A method of fabricating an FFS-LCD device according to a second embodiment of the present invention is the same as the method according to the first embodiment, except for a second mask process and a third mask process. Therefore, explanations about the same mask processes will be omitted.

FIGS. 11A to 11L are sectional views showing, in detail, the second mask process and the third mask process according to the second embodiment of the present invention.

Figure 11A:
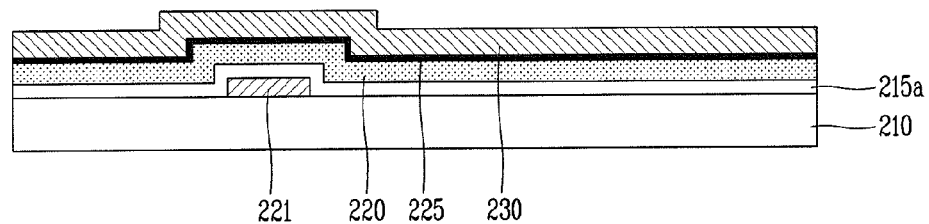
FIGS. 11A to 11L are sectional views showing, in detail, a second mask process and a third mask process according to a second embodiment of the present invention.

As shown in FIG. 11A, on an entire surface of an array substrate 210 where a gate electrode 221, a gate line (not shown), and a gate pad line (not shown) have been formed, sequentially deposited are a gate insulation film 215a, an amorphous silicon thin film 220, an n+ amorphous silicon thin film 225 and a second conductive film 230.

As aforementioned, the second conductive film 230 may have a multi-layered structure in which at least two low resistance opaque conductive materials such as copper, copper alloy and aluminum are laminated, so as to form a source electrode, a drain electrode and a data line.

Figure 11B:
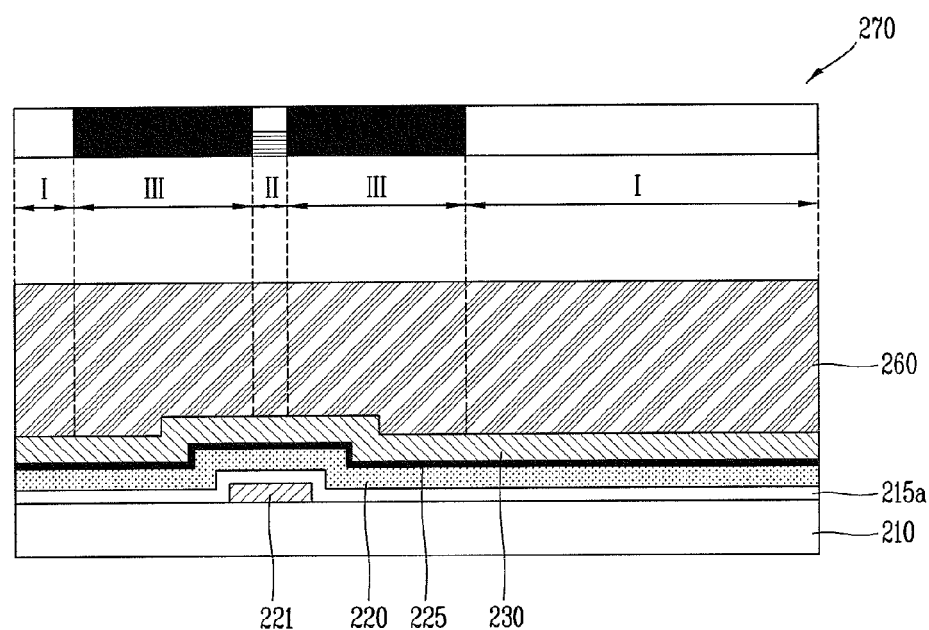

As shown in FIG. 11B, a photosensitive film 260 formed of a photosensitive material such as a photoresist is formed on the array substrate 210 where the second conductive film 230 has been formed. Then, light is selectively irradiated onto the photosensitive film 260 through a half-tone mask 270 according to the second embodiment of the present invention.

The half-tone mask 270 includes a first transmission region (I) for transmitting all of irradiated light, a second transmission region (II) for transmitting some of irradiated light and shielding others of the irradiated light, and a shielding region (III) for shielding all of irradiated light. Only light having passed through the half-tone mask 270 is irradiated onto the photosensitive film 260.

Figure 11C:
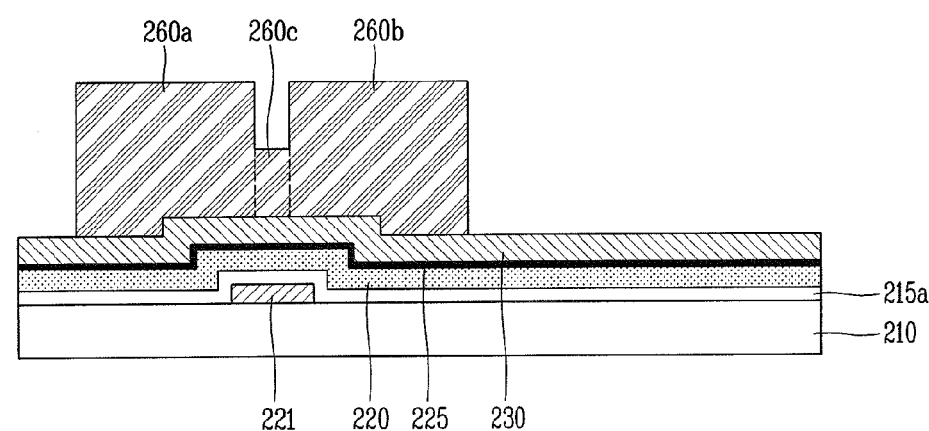

Then, the photosensitive film 260 having been exposed to light through the half-tone mask 270 is developed. As a result, as shown in FIG. 11C, a first photosensitive film pattern 260a to a third photosensitive film pattern 260c having predetermined thicknesses remain in the shielding region (III) and the second transmission region (II) where light has been shielded completely or partially. And, the photosensitive film 260 is completely removed in the first transmission region (I), thereby exposing the surface of the second conductive film 230.

The first photosensitive film pattern 260a and the second photosensitive film pattern 260b formed in the shielding region (III) have a thickness thicker than that of the third photosensitive film pattern 260c formed in the second transmission region (II). And, the photosensitive film is completely removed in the first transmission region (I) since a positive type of photoresist has been used. However, the present invention is not limited to this. That is, a negative type of photoresist may be used.

Figure 11D:
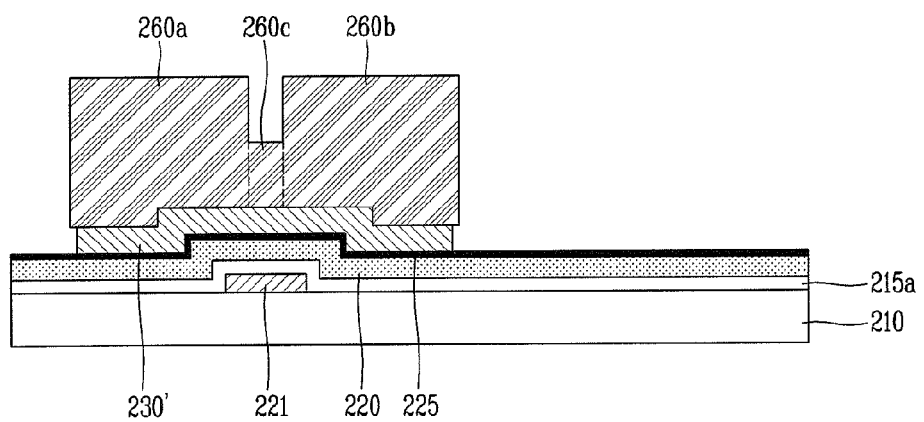

As shown in FIG. 11D, part of the second conductive film is selectively removed, through a wet etching, by using the first photosensitive film pattern 260a to the third photosensitive film pattern 260c as a mask. As a result, a conductive film pattern 230' formed of the second conductive film is disposed in the pixel portion of the array substrate 110.

Figure 11E:
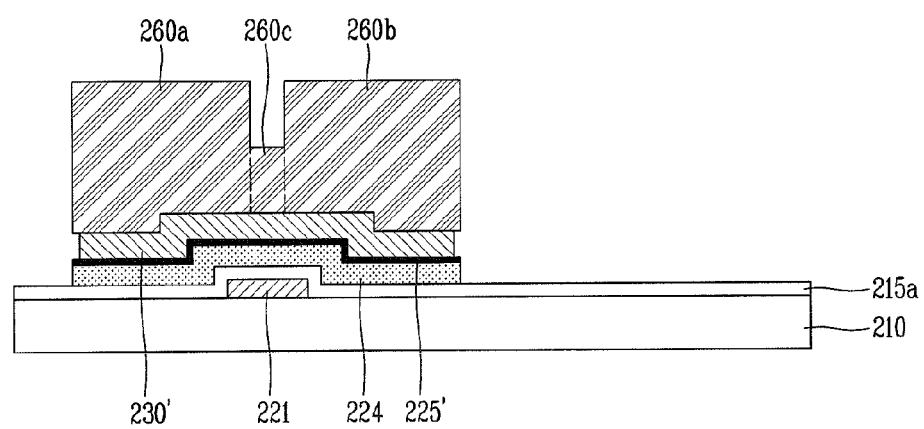

As shown in FIG. 11E, parts of the amorphous silicon thin film and the n+ amorphous silicon thin film are selectively removed, through a dry etching, by using the first photosensitive film pattern 260a to the third photosensitive film pattern 260c as a mask. As a result, an active layer 224 and an n+ amorphous silicon thin film pattern 225' formed of the amorphous silicon thin film and the n+ amorphous silicon thin film are disposed below the conductive film pattern 230', respectively.

Figure 11F:
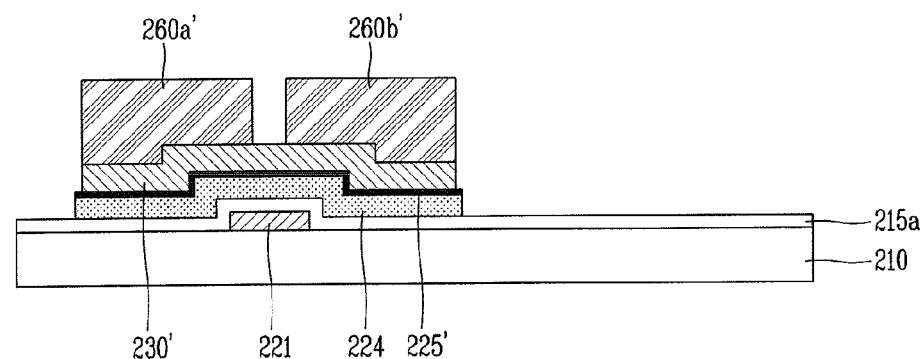

Then, an ashing process is performed to remove part of the thicknesses of the first photosensitive film pattern 260a to the third photosensitive film pattern 260c. As a result, as shown in FIG. 11F, the third photosensitive film pattern in the second transmission region (II) is completely removed.

The first photosensitive film pattern 260a and the second photosensitive film pattern 260b undergo a process for removing a thickness by a thickness of the third photosensitive film pattern 260c, thereby remaining in the shielding region (III) as a fourth photosensitive film pattern 260a' and a fifth photosensitive film pattern 260b'.

Figure 11G:
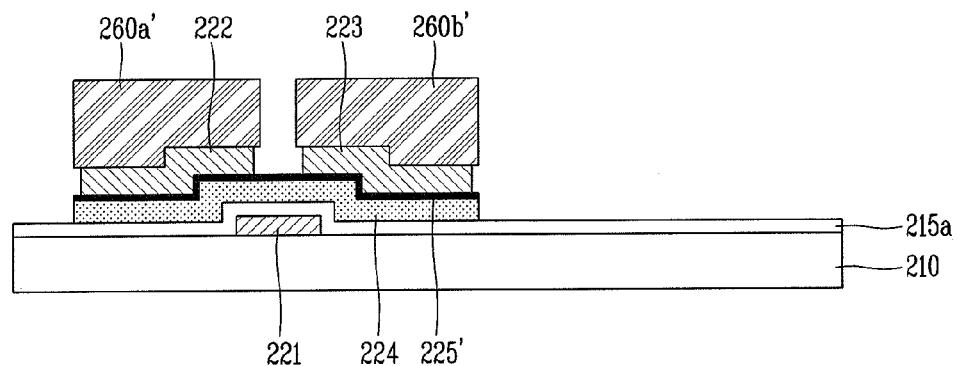

As shown in FIG. 11G, part of the conductive film pattern is selectively removed, through a wet etching, by using the fourth photosensitive film pattern 260a' and the fifth photosensitive film pattern 260b' as a mask. As a result, a source electrode 222 and a drain electrode 223 formed of the second conductive film are disposed on the n+ amorphous silicon thin film pattern 225'. Although not shown, in the pixel portion of the array substrate 210, disposed is a data line which defines a pixel region together with the gate line and formed of the second conductive film. And, a data pad line formed of the second conductive film is disposed in a data pad portion of the array substrate 210.

Figure 11H:
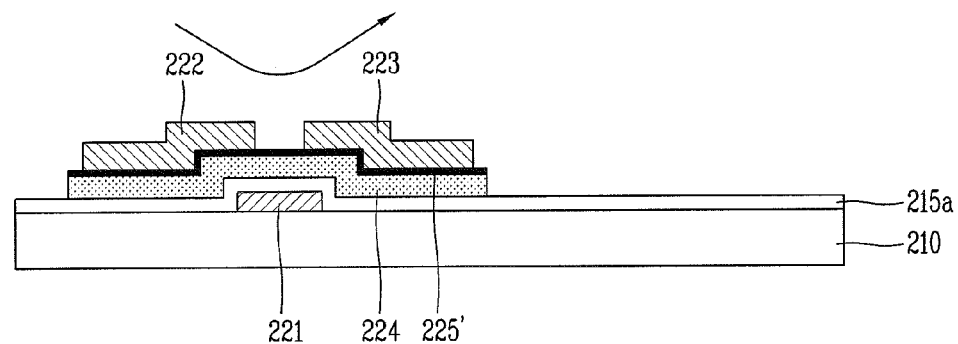

As shown in FIG. 11H, the fourth photosensitive film pattern 260a' and the fifth photosensitive film pattern 260b' are removed through a wet strip process.

Like in the first embodiment, in the second embodiment of the present invention, ITO erosion occurring when patterning a pixel electrode may be prevented by using a wet strip, rather than a dry strip using a gas such as $SF_6$ which reacts with copper.

Figure 11I:
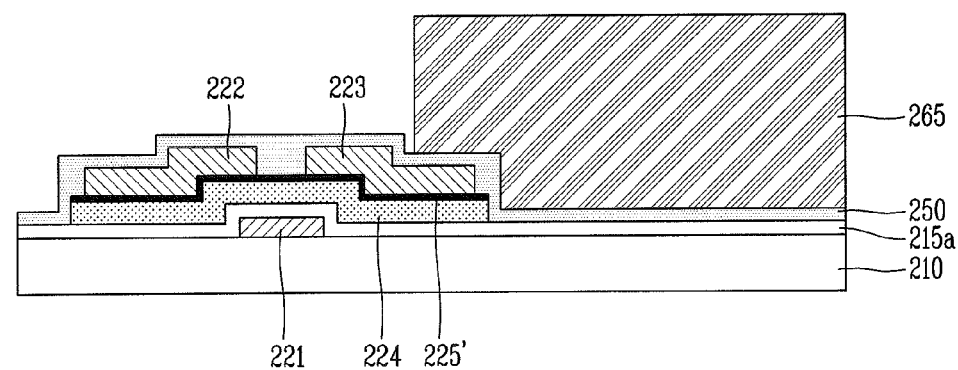

As shown in FIG. 11I, a third conductive film 250 is deposited on an entire surface of the array substrate 210, and then a photosensitive film pattern 265 is formed thereon through a mask process. The third conductive film 250 may be formed of a transparent conductive material of a high transmittance such as ITO or IZO, so as to form a pixel electrode.

Figure 11J:
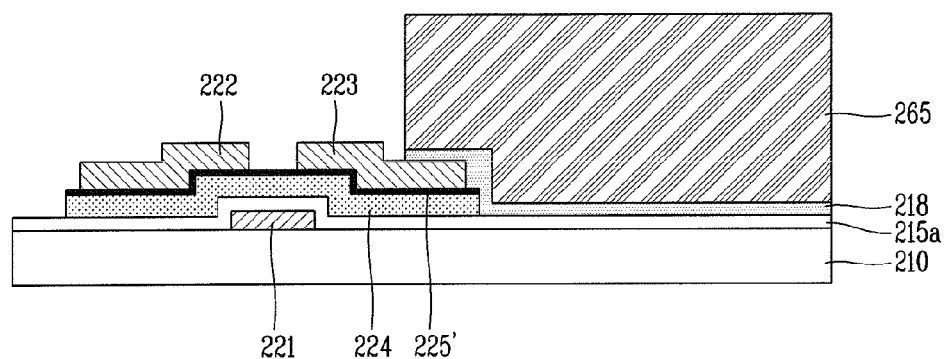

As shown in FIG. 11J, part of the third conductive film is selectively removed, through a wet etching, by using the photosensitive film pattern 265 as a mask. As a result, implemented is a pixel electrode 218 formed of the third conductive film and directly and electrically connected to the drain electrode 223.

Figure 11K:
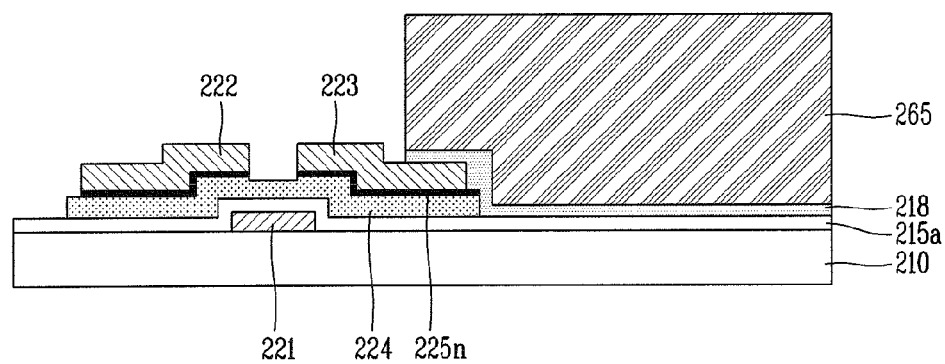

As shown in FIG. 11K, part of the n+ amorphous silicon thin film pattern is selectively removed (back channel-etched) through a dry etching. As a result, implemented is an ohmic-contact layer 225n formed of the n+ amorphous silicon thin film.

In this case, an inferior connection between the drain electrode 223 and the pixel electrode 218 does not occur even if a dry etching is used for the back channel-etching. The reason is because the pixel electrode 218 has been already formed on the drain electrode 223.

Figure 11L:
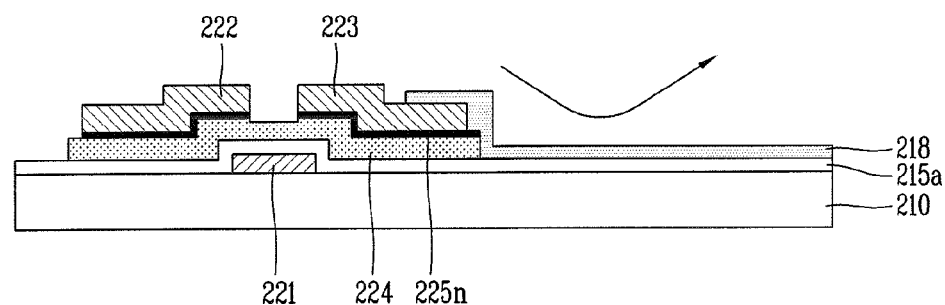

As shown in FIG. 11L, the photosensitive film pattern 265 is removed through a wet strip process.

In the FFS-LCD device according to the first and second embodiments of the present invention, a back channel etching is performed after ITO deposition. However, the present invention is not limited to this. That is, a gas such as $SF_6$ and $Cl_2$ used for a dry etching is controlled, thereby allowing a direct contact between copper and ITO. This will be explained in more details in a third embodiment of the present invention.

FIGS. 12A to 12E are sectional views sequentially showing processes of fabricating an array substrate according to a third embodiment of the present invention.

Figure 12A:
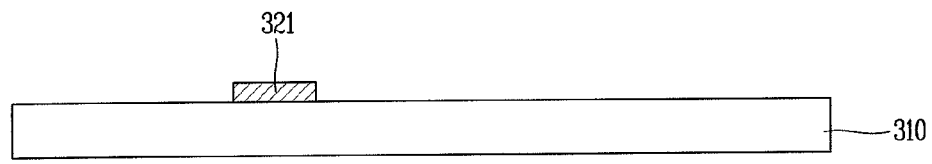
FIGS. 12A to 12E are sectional views sequentially showing processes of fabricating an array substrate according to a third embodiment of the present invention.

As shown in FIG. 12A, on the pixel portion of an array substrate 310 formed of a transparent insulating material such as glass, disposed are a gate electrode 321 and a gate line (not shown). And, a gate pad line (not shown) is disposed on a gate pad portion of the array substrate 310.

The gate electrode 321, the gate line, and the gate pad line are formed by depositing a first conductive film on an entire surface of the array substrate 310, and then by selectively patterning the first conductive film through a photolithography process (first mask process).

Figure 12B:
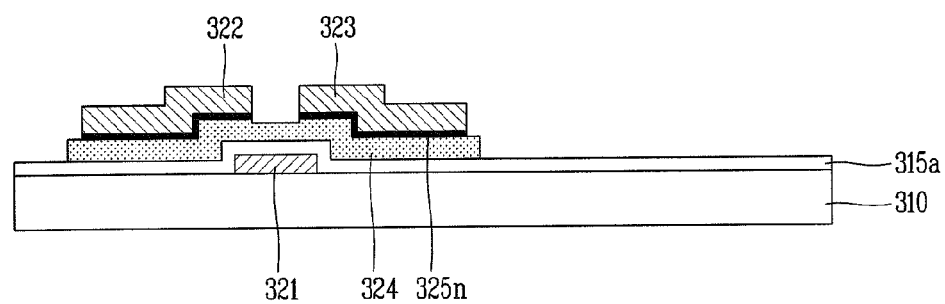

As shown in FIG. 12B, on an entire surface of the array substrate 310 where the gate electrode 321, the gate line and the gate pad line have been formed, formed are a gate insulation film 315a, an amorphous silicon thin film, an n+ amorphous silicon thin film and a second conductive film. The second conductive film may have a multi-layered structure in which at least two low resistance opaque conductive materials such as copper, copper alloy and aluminum are laminated, so as to form a source electrode, a drain electrode and a data line.

Then, the amorphous silicon thin film, the n+ amorphous silicon thin film and the second conductive film are selectively removed through a photolithography process (second mask process). As a result, an active layer 324 formed of the amorphous silicon thin film is disposed in the pixel portion of the array substrate 310, and a source electrode 322 and a drain electrode 323 formed of the second conductive film are formed on the active layer 324.

A data line (not shown) which defines a pixel region together with the gate line is formed, through the second mask process, in the pixel portion of the array substrate 310. And, a data pad line (not shown) formed of the second conductive film is disposed in a data pad portion of the array substrate 310.

Between the active layer 324 and the source and drain electrodes 322 and 323, formed is an ohmic-contact layer 325n which ohmic-contacts source and drain regions of the active layer 324 with the source and drain electrodes 322 and 323.

Figure 12C:
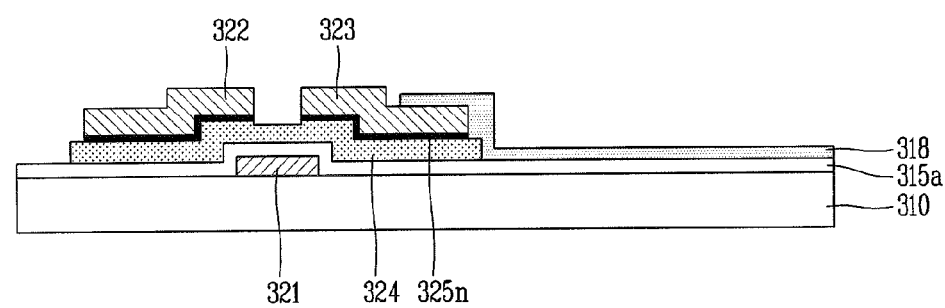

As shown in FIG. 12C, a third conductive film is formed on an entire surface of the array substrate 310 where the active layer 324, the source electrode 322, the drain electrode 323 and the data line have been formed.

Then, the third conductive film is selectively removed through a photolithography process (third mask process), thereby forming, in the pixel region, a pixel electrode 318 formed of the third conductive film and electrically connected to the drain electrode 323.

Hereinafter, the second mask process and the third mask process according to the third embodiment of the present invention will be explained in more details with reference to the attached drawings.

FIGS. 13A to 13L are sectional views showing, in detail, the second mask process and the third mask process shown in FIGS. 12B and 12C according to the third embodiment of the present invention.

Figure 13A:
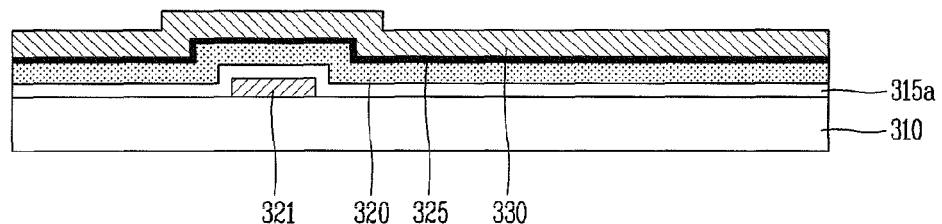
FIGS. 13A to 13L are sectional views showing, in detail, a second mask process and a third mask process of FIGS. 12B and 12C according to a third embodiment of the present invention.

As shown in FIG. 13A, on an entire surface of an array substrate 310 where a gate electrode 321, a gate line, and a gate pad line have been formed, sequentially deposited are a gate insulation film 315a, an amorphous silicon thin film 320, an n+ amorphous silicon thin film 325 and a second conductive film 330.

As aforementioned, the second conductive film 330 may have a multi-layered structure in which at least two low resistance opaque conductive materials such as copper, copper alloy and aluminum are laminated, so as to form a source electrode, a drain electrode and a data line.

Figure 13B:
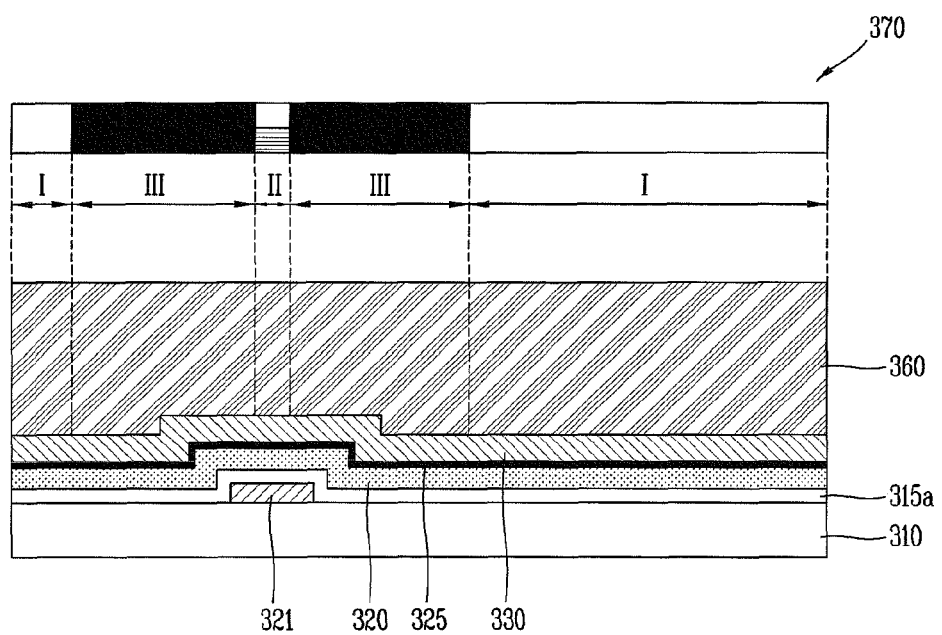

As shown in FIG. 13B, a photosensitive film 360 formed of a photosensitive material such as a photoresist is formed on the array substrate 310 where the second conductive film 330 has been formed. Then, light is selectively irradiated onto the photosensitive film 360 through a half-tone mask 370 according to the third embodiment of the present invention.

The half-tone mask 370 includes a first transmission region (I) for transmitting all of irradiated light, a second transmission region (II) for transmitting some of irradiated light and shielding others of the irradiated light, and a shielding region (III) for shielding all of irradiated light. Only light having passed through the half-tone mask 370 is irradiated onto the photosensitive film 360.

Figure 13C:
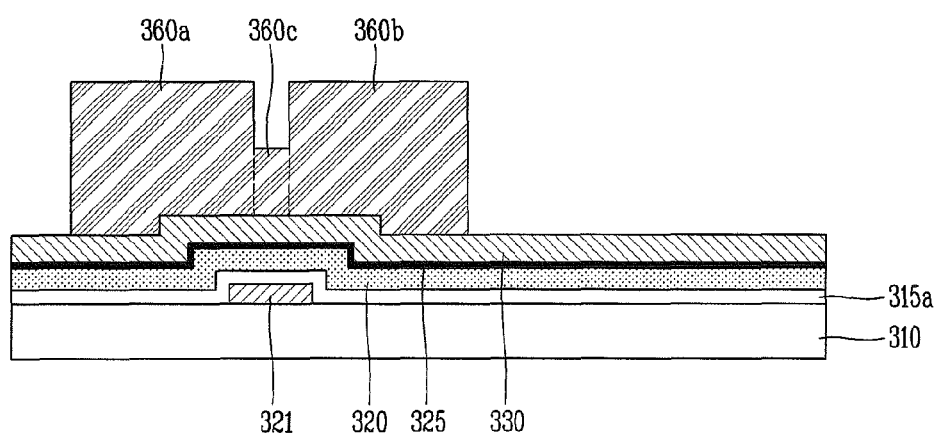

Then, the photosensitive film 360 having been exposed to light through the half-tone mask 370 is developed. As a result, as shown in FIG. 13C, a first photosensitive film pattern 360a to a third photosensitive film pattern 360c having predetermined thicknesses remain in the shielding region (III) and the second transmission region (II) where light has been shielded completely or partially. And, the photosensitive film 360 is completely removed in the first transmission region (I), thereby exposing the surface of the second conductive film 330.

The first photosensitive film pattern 360a and the second photosensitive film pattern 360b formed in the shielding region (III) have a thickness thicker than that of the third photosensitive film pattern 360c formed in the second transmission region (II). And, the photosensitive film is completely removed in the first transmission region (I) since a positive type of photoresist has been used. However, the present invention is not limited to this. That is, a negative type of photoresist may be used.

Figure 13D:
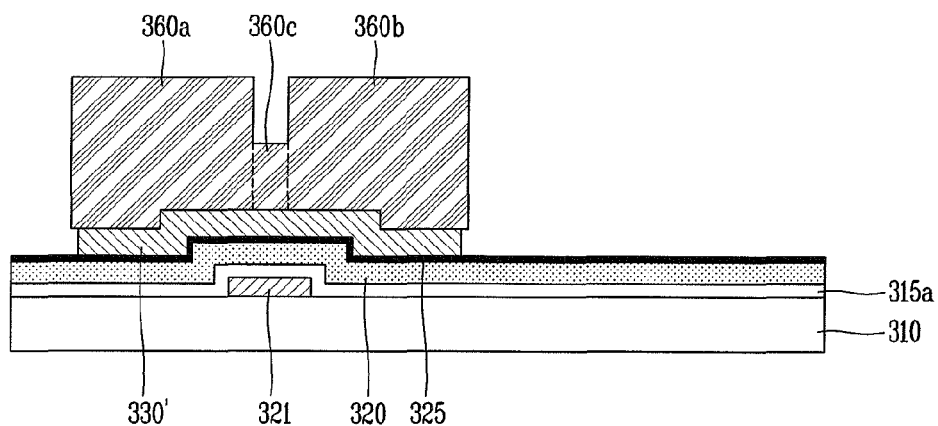

As shown in FIG. 13D, part of the second conductive film is selectively removed, through a wet etching, by using the first photosensitive film pattern 360a to the third photosensitive film pattern 360c as a mask. As a result, a conductive film pattern 330' formed of the second conductive film is disposed in the pixel portion of the array substrate 310.

Figure 13E:
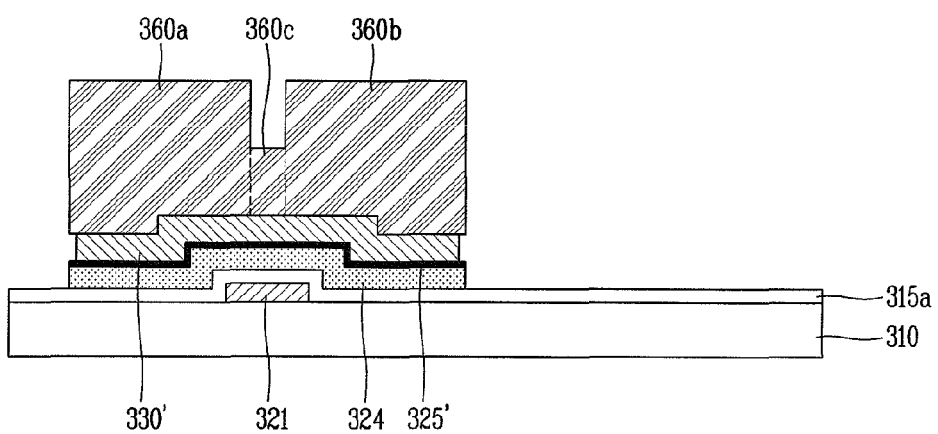

As shown in FIG. 13E, parts of the amorphous silicon thin film and the n+ amorphous silicon thin film are selectively removed, through a dry etching, by using the first photosensitive film pattern 360a to the third photosensitive film pattern 360c as a mask. As a result, an active layer 324 and an n+ amorphous silicon thin film pattern 325' formed of the amorphous silicon thin film and the n+ amorphous silicon thin film are disposed below the conductive film pattern 330', respectively.

Figure 13F:
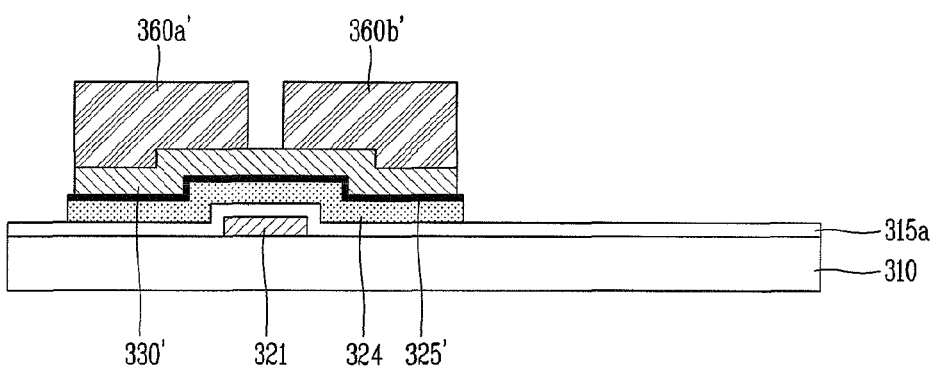

Then, an ashing process is performed to remove part of the thicknesses of the first photosensitive film pattern 360a to the third photosensitive film pattern 360c. As a result, as shown in FIG. 13F, the third photosensitive film pattern in the second transmission region (II) is completely removed.

The first photosensitive film pattern 360a and the second photosensitive film pattern 360b undergo a process for removing a thickness by a thickness of the third photosensitive film pattern 360c, thereby remaining in the shielding region (III) as a fourth photosensitive film pattern 360a' and a fifth photosensitive film pattern 360b'.

Figure 13G:
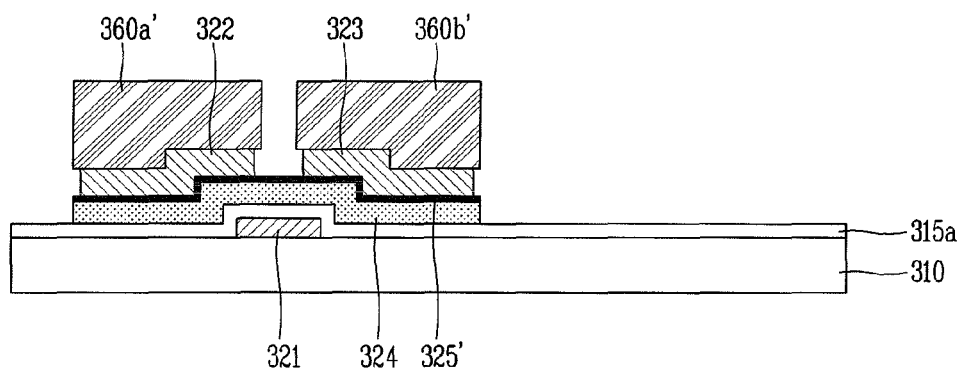

As shown in FIG. 13G, part of the conductive film pattern is selectively removed, through a wet etching, by using the fourth photosensitive film pattern 360a' and the fifth photosensitive film pattern 360b' as a mask. As a result, a source electrode 322 and a drain electrode 323 formed of the second conductive film are disposed on the n+ amorphous silicon thin film pattern 325'. Although not shown, in the pixel portion of the array substrate 310, disposed is a data line which defines a pixel region together with the gate line and formed of the second conductive film. And, a data pad line formed of the second conductive film is disposed in a data pad portion of the array substrate 310.

Figure 13H:
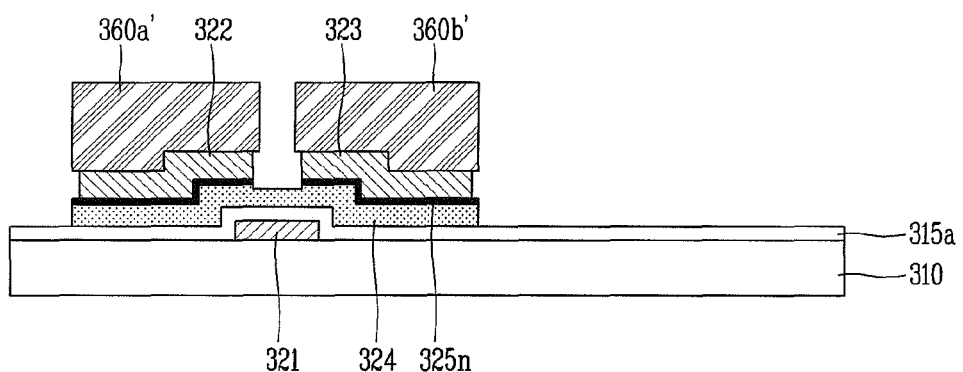

As shown in FIG. 13H, part of the n+ amorphous silicon thin film pattern is selectively removed (back channel-etched), through a dry etching, by using the fourth photosensitive film pattern 360a' and the fifth photosensitive film pattern 360b' as a mask. As a result, implemented is an ohmic-contact layer 325n formed of the n+ amorphous silicon thin film.

Generally, a gas mixture of $SF_6$, $Cl_2$, He, etc. is used to perform the dry etching. However, in the third embodiment of the present invention, a plasma gas having $Cl_2$ removed therefrom is used.

More concretely, $Cl_2$ used for the back channel etching causes $CuCl_2$ to be disposed at an edge portion of a data line formed of copper. This may result in an inferior connection between copper and ITO. As a result, ITO erosion occurs at the edge portion when patterning a pixel electrode. The $Cl_2$ is used to enhance a selective etching of the active layer 324 formed of an amorphous silicon thin film, and the gate insulation film 315a. Therefore, the $Cl_2$ may be removed by controlling process conditions.

Figure 13I:
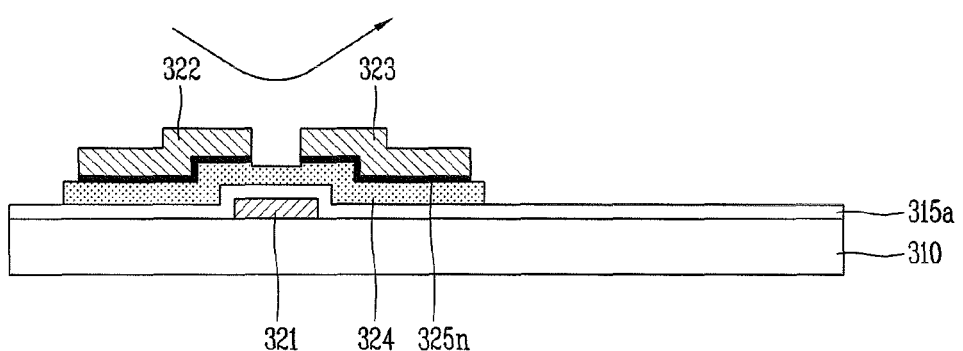

As shown in FIG. 13I, the fourth photosensitive film pattern 360a' and the fifth photosensitive film pattern 360b' are removed through a wet strip process.

Figure 13J:
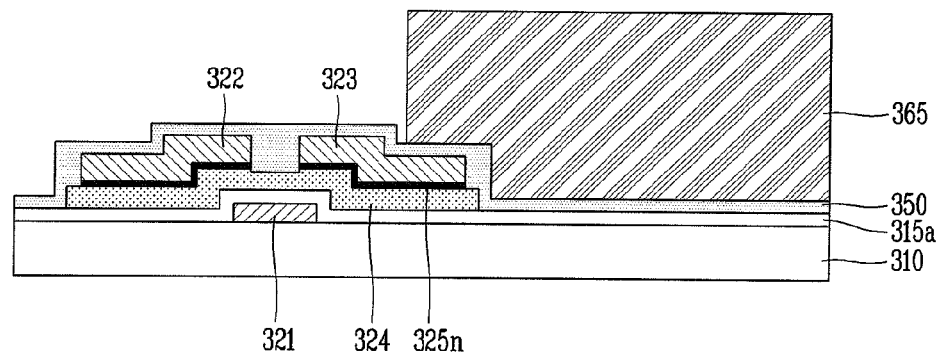

As shown in FIG. 13J, a third conductive film 350 is deposited on an entire surface of the array substrate 310, and then a photosensitive film pattern 365 is formed thereon through a mask process. The third conductive film 350 may be formed of a transparent conductive material of a high transmittance such as ITO or IZO, so as to form a pixel electrode.

Figure 13K:
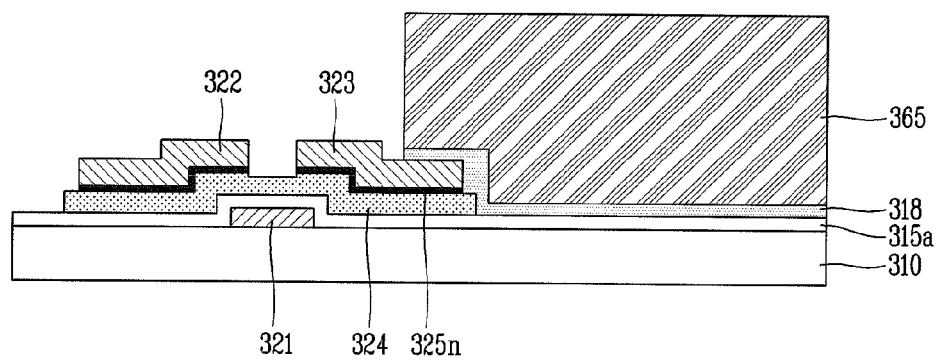

As shown in FIG. 13K, part of the third conductive film is selectively removed, through a wet etching, by using the photosensitive film pattern 365 as a mask. As a result, implemented is a pixel electrode 318 formed of the third conductive film and directly and electrically connected to the drain electrode 323.

Figure 13L:
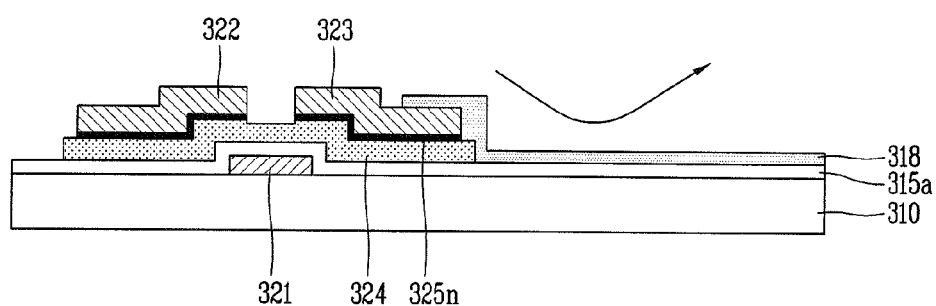

As shown in FIG. 13L, the photosensitive film pattern 365 is removed through a wet strip process.

Figure 12D:
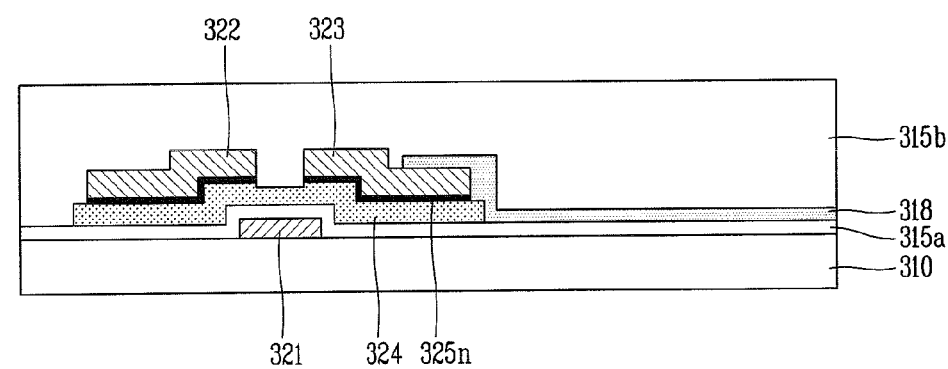

After the pixel electrode 318 has been formed, as shown in FIG. 12D, a passivation film 315b is formed on an entire surface of the array substrate 310.

Then, the gate insulation film 315a and the passivation film 315b are selectively removed through a photolithography process (fourth mask process). As a result, a first contact hole (not shown) and a second contact hole (not shown) which expose part of the data pad line and the gate pad line, respectively are formed at a data pad portion and a gate pad portion of the array substrate 310.

Figure 12E:
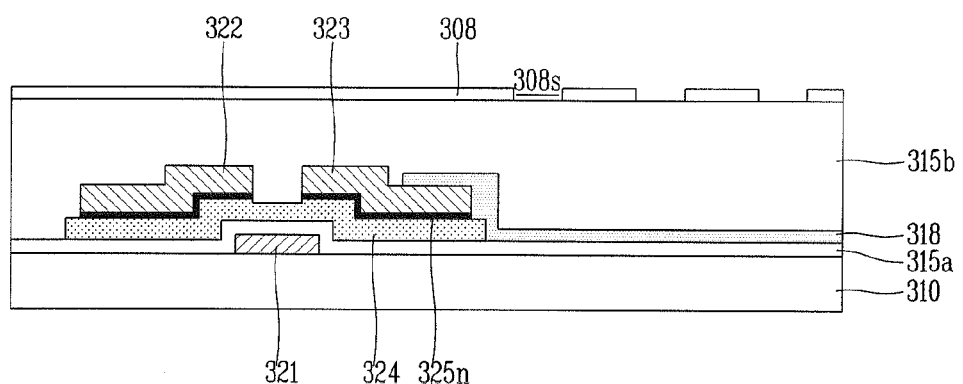

As shown in FIG. 12E, a fourth conductive film is formed on an entire surface of the array substrate 310 where the passivation film 315b has been formed. Then, the fourth conductive film is selectively removed through a photolithography process (fifth mask process). As a result, a common electrode 308 formed of the fourth conductive film is disposed in the pixel portion of the array substrate 310.

The fourth conductive film is selectively removed through the fourth mask process. As a result, a data pad electrode (not shown) and a gate pad electrode (not shown) electrically connected to the data pad line and the gate pad line through the first contact hole and the second contact hole are formed at the data pad portion and the gate pad portion, respectively.

The common electrode 308 is formed in a single pattern over the pixel portion, and includes a plurality of slits 308s therein so as to generate a fringe field together with the pixel electrode 318.

The array substrate according to the first to third embodiments of the present invention is bonded to a color filter substrate by a sealant formed at an outer periphery of an image display region. The color filter substrate is provided with color filters for implementing red, green and blue (RGB) colors.

The color filter substrate and the array substrate are bonded to each other by a bonding key of the color filter substrate or the array substrate.

The FFS-LCD device according to the first to third embodiments of the present invention is applied to an amorphous silicon TFT (thin film transistor) using an amorphous silicon thin film as an active layer. However, the present invention is not limited to this. That is, the present invention may be also applied to a polycrystalline silicon TFT (thin film transistor) using a polycrystalline silicon thin film as an active layer.

Furthermore, the present invention may be applied not only to an LCD device, but also to other display device using a TFT, e.g., an organic light emitting diodes (OLED) display in which an OLED is connected to a driving transistor.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method of fabricating a fringe field switching (FFS)-liquid crystal display (LCD) device, comprising:
    forming a gate electrode and a gate line on a first substrate;
    forming a gate insulation film on the first substrate where the gate electrode and the gate line have been formed;

forming an active layer and source and drain electrodes over the gate electrode and forming a data line which defines a pixel region by crossing the gate line through a single mask process;

forming a pixel electrode electrically connected to the drain electrode through a single mask process, wherein the method, wherein the step of forming the active layer, the source and drain electrodes, and the pixel electrode comprises:

forming, on the gate insulation film, an amorphous silicon thin film, an n+ amorphous silicon thin film and a second conductive film;

forming, on the second conductive film, first to third photosensitive film pattern;

selectively removing the second conductive film by using the first to third photosensitive film patterns as a mask, thereby disposing a conductive film pattern formed of the second conductive film;

selectively removing the amorphous silicon thin film and the n+ amorphous silicon thin film by using the first to third photosensitive film patterns as a mask, thereby disposing an active layer and an n+ amorphous silicon thin film pattern formed of the amorphous silicon thin film and the n+ amorphous silicon thin film, below the conductive film pattern;

removing the third photosensitive film pattern through an ashing process, and forming fourth and fifth photosensitive film patterns having a thickness removed by a thickness of the third photosensitive film pattern;

selectively removing the conductive film pattern by using the fourth and fifth photosensitive film patterns as a mask, thereby disposing source and drain electrodes formed of the second conductive film on the n+ amorphous silicon thin film pattern;

removing the fourth and fifth photosensitive film patterns;

forming a third conductive film on an entire surface of the first substrate;

forming a photosensitive film pattern on the third conductive film;

and selectively removing the third conductive film by using the photosensitive film pattern as a mask, thereby disposing a pixel electrode directly electrically connected to the drain electrode and formed of the third conductive film;

forming a passivation film on the first substrate where the pixel electrode has been formed;

forming a common electrode formed in a single pattern over a pixel portion, and configured to generate a fringe field with a plurality of slits in each pixel region together with the pixel electrode; and bonding the first substrate to a second substrate, wherein an ohmic-contact layer is formed between the active layer and the source and drain electrodes by performing a back channel etching after the pixel electrode has been formed.

2. The method of claim 1, wherein the second conductive film has a multi-layer structure of at least two layers having thereon a low resistance opaque conductive material including copper, or a copper alloy, or aluminum.

3. The method of claim 1, wherein the third conductive film is formed of a transparent conductive material of a high transmittance including indium-tin-oxide (ITO) or indium-zinc-oxide (IZO).

4. The method of claim 1, wherein the fourth and fifth photosensitive film patterns are removed through a wet strip process.

5. The method of claim 1, further comprising removing the photosensitive film pattern through a wet strip process.

6. The method of claim 5, further comprising forming an ohmic-contact layer between the active layer and the source and drain electrodes by selectively removing the n+ amorphous silicon thin film pattern.

7. The method of claim 1, further comprising:

forming an ohmic-contact layer between the active layer and the source and drain electrodes by selectively removing the n+ amorphous silicon thin film pattern, by using the photosensitive film pattern as a mask.

8. The method of claim 7, further comprising removing the photosensitive film pattern through a wet strip process.

* * * * *